(12) United States Patent
Iwane et al.

(10) Patent No.: US 6,682,990 B1
(45) Date of Patent: Jan. 27, 2004

(54) SEPARATION METHOD OF SEMICONDUCTOR LAYER AND PRODUCTION METHOD OF SOLAR CELL

(75) Inventors: Masaaki Iwane, Hiratsuka (JP); Katsumi Nakagawa, Atsugi (JP); Makoto Iwakami, Atsugi (JP); Shoji Nishida, Hiratsuka (JP); Noritaka Ukiyo, Atsugi (JP); Yukiko Iwasaki, Atsugi (JP); Masaki Mizutani, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 520 days.

(21) Appl. No.: 09/656,014

(22) Filed: Sep. 7, 2000

(30) Foreign Application Priority Data

Sep. 9, 1999 (JP) .............................. 11-255645

(51) Int. Cl.$^7$ .................... H01L 21/30; H01L 31/18
(52) U.S. Cl. .................... 438/458; 438/455; 438/409; 438/405; 438/960; 438/977; 438/64; 438/67; 438/80; 136/261; 136/251; 136/244
(58) Field of Search ................. 438/458, 455, 438/409, 405, 960, 977, 64, 67, 80; 136/261, 251, 244

(56) References Cited

U.S. PATENT DOCUMENTS

| | | | |
|---|---|---|---|
| 4,778,478 A | 10/1988 | Barnett | 438/62 |
| 5,544,616 A | 8/1996 | Ciszek et al. | 117/60 |
| 5,811,348 A | * 9/1998 | Matsushita et al. | 438/455 |
| 6,214,701 B1 | * 4/2001 | Matsushita et al. | 438/458 |
| 2002/0000242 A1 | * 1/2002 | Matsushita et al. | 136/244 |

FOREIGN PATENT DOCUMENTS

| | | |
|---|---|---|
| DE | 4318663 C1 * | 10/1994 |
| JP | 7-29859 A * | 1/1995 |
| JP | 8-46018 | 2/1996 |
| JP | 8-213645 | 8/1996 |

* cited by examiner

Primary Examiner—Alan Diamond
(74) Attorney, Agent, or Firm—Fitzpatrick, Cella, Harper & Scinto

(57) ABSTRACT

The separation method of a semiconductor layer according to the present invention comprises separating a semiconductor layer and a semiconductor substrate at a separation layer formed therebetween, wherein a face of the semiconductor layer at the side opposite to the separation layer and/or a face of the semiconductor substrate at the side opposite to the separation layer are held by utilizing an ice layer, whereby it is unnecessary to use an adhesive as holding means and at the same time it is possible to easily and uniformly separate them.

16 Claims, 23 Drawing Sheets

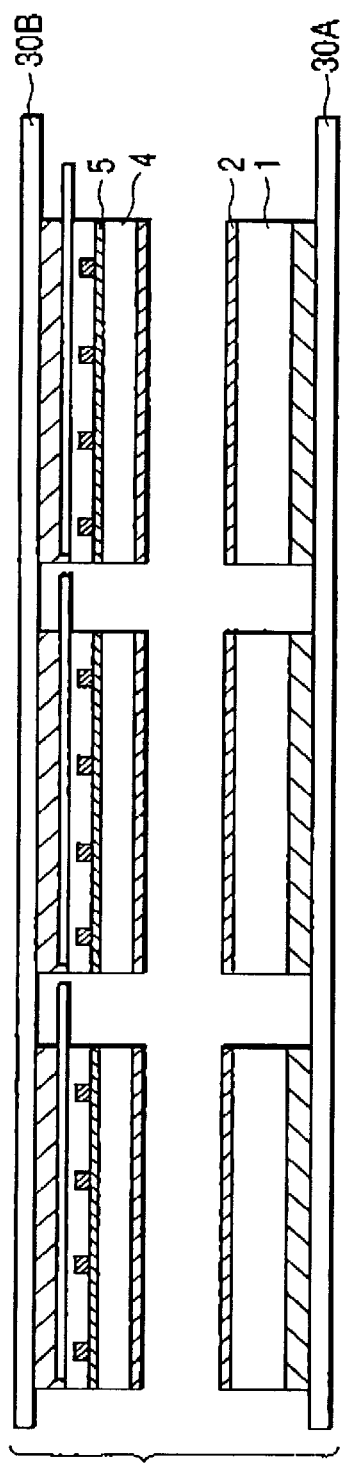
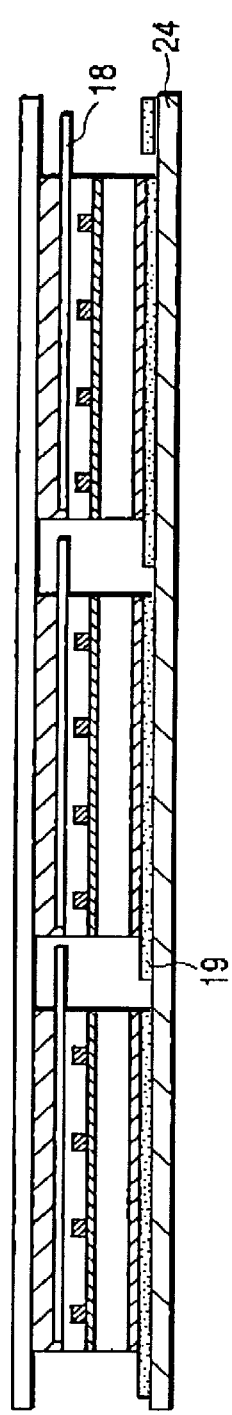
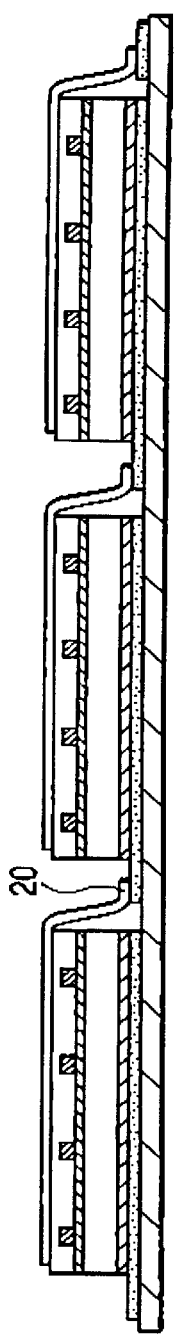
FIG. 7A
FIG. 7B
FIG. 7C

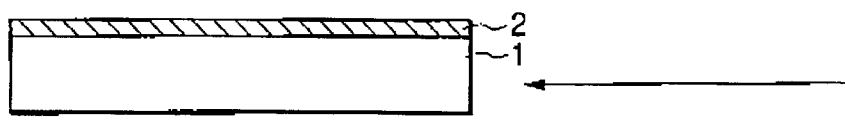
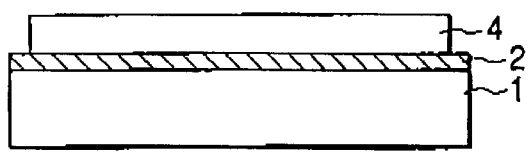
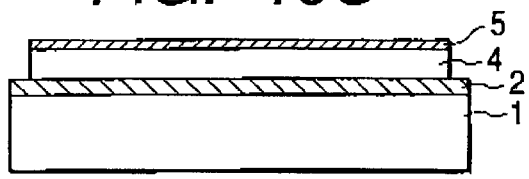
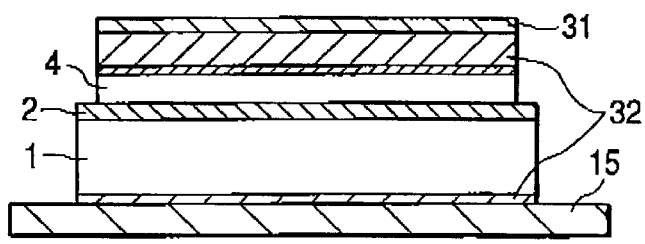
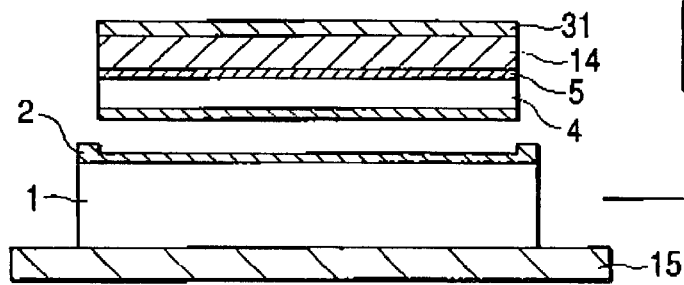
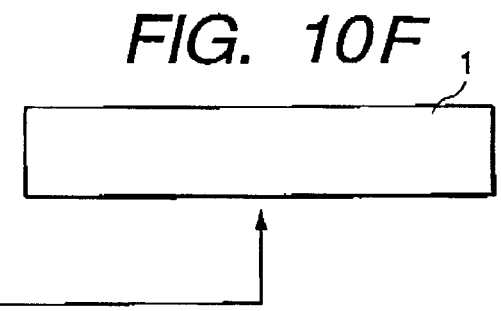

TO VACUUM OR ARGON INLET

US 6,682,990 B1

SEPARATION METHOD OF SEMICONDUCTOR LAYER AND PRODUCTION METHOD OF SOLAR CELL

BACKGROUND OF THE INVENTION

1. Field of the Invention

This invention relates to a separation method of a semiconductor layer, and a production method of a solar cell using the semiconductor layer separated by the above separation method.

2. Related Background Art

The greenhouse effect gases, e.g., carbon dioxide and nitrogen oxides resulting from burning oil at thermal power plants and gasoline by vehicles, are polluting the global environments. Therefore, power generation by solar cells has been increasingly attracting attention, viewed from the above environmental concerns and anticipated depletion of crude oil.

The solar cell of thin-film crystal silicon (Si) has various advantages; it can be produced at low cost, because of its thin power generation layer which decreases required quantity of a Si raw material, the power generating layer of crystal Si can exhibit a higher conversion efficiency and durability than the other types of solar cells, e.g., that using amorphous Si, and it can be bent to some extent, which makes it applicable to curved surfaces, e.g., car bodies, home electric appliances and roofs.

Japanese Patent Application Laid-Open No. 8-213645 discloses a method of separating thin-film single-crystal Si using an epitaxial layer grown on a porous Si layer, in order to realize a solar cell of thin-film crystal Si. FIG. 23 shows a schematic section explaining the method of producing the solar cell of thin-film Si, disclosed by Japanese Patent Application Laid-open No. 8-213645, where 101: Si wafer, 102: porous Si layer, 103: $p^+$ type single-crystal Si layer, 104: $p^-$ type single-crystal Si layer, 105: $n^+$ type single-crystal Si layer, 106: protective layer, 109 and 111: adhesives, and 110 and 112: jigs. In the method of producing solar cell, shown in FIG. 23, the porous Si layer 102 is formed on the surface of the Si wafer 101 by anodization. Then, the $p^+$ type single-crystal Si layer 103 is epitaxially grown on the porous Si layer 102, and then the $p^-$ type single-crystal Si layer 104 and $n^+$ type single-crystal Si layer 105 are grown thereon, in this order. The protective layer 106 is further formed thereon. The protective layer 106 and Si wafer 101 are adhered to the jigs 112 and 110, respectively, by adhesives 111 and 109. A tensile force P is applied to the jigs 112 and 109, to separate the Si wafer 101 from the single-crystal Si layers 103, 104 and 105 as epitaxial layers at the porous Si layer 102. These single-crystal Si layers 103, 104 and 105 are used to produce a solar cell. The used Si wafer 101 can be recycled to reduce the production cost.

One of the methods of forming single-crystal or a polycrystalline Si is a liquid-phase growth method. This method can produce at a low cost a thick Si layer needed as the power generation layer for solar cells, in comparison with the other methods including a chemical vapor deposition (CVD) method. U.S. Pat. No. 4,778,478 discloses a concrete example of the method of liquid-phase growth. FIG. 21 shows a schematic section of the slide type apparatus for liquid-phase growth, disclosed by U.S. Pat. No. 4,778,478, where 50: slide board of a refractory material, e.g., graphite, 54 and 56: solvent reservoirs, 58: movable slide of metallic substrate, 60: cavity at the boat bottom, 63: barrier layer, 68 and 70: solvents, 72: portion to which a transparent electroconductive electrode is attached, 75: nozzle for forming an antireflection layer, 74: chamber for containing the nozzle 75, 76: wheel, and 78: nozzle for forming the barrier layer 63. This apparatus first unwinds the movable slide 58 wound like a roll on the wheel 76, and forms the barrier layer 63 by the nozzle 78. It then forms the semiconductor layer as the power generating layer, grown in liquid phase from the solvents 68 and 70 in the reservoirs 54 and 56; the transparent electrode at the portion to which the transparent electrode is attached; and the antireflection layer by the nozzle 75, to produce the solar cell. This method efficiently effects the slide type liquid phase growth, and is advantageous for mass production of solar cells.

U.S. Pat. No. 5,544,616 discloses a dipping type apparatus for liquid-phase growth. FIG. 22 shows the schematic section of this apparatus, where 201: outlet, 202: quartz crucible, 203: boat of graphite, 204: heater, 205: nozzle from which argon gas is injected, 206: thermocouples, 208: lid, 209: insulated region, and 210: supporting table of graphite. This apparatus grows a semiconductor layer on a substrate by dipping the substrate in the solvent held in the quartz crucible 202.

Japanese Patent Application Laid-Open No. 8-46018 discloses a method, in which a wafer is supported by adsorbing its back side on a table via an ice layer. In this method, since the wafer was diced with a low-elasticity dicing tape attached to its back side, strain was generated in the wafer during the dicing step, thereby leading to chipping and cracking of the wafer. Therefore, this application discloses that use of a high-elasticity ice layer for the support of the wafer prevents the above problem and dispenses with a dicing tape, thereby improving dicing efficiency.

Japanese Patent Application Laid-Open No. 8-213645 discloses a method of separating a single-crystal Si layer from an Si wafer, in which the single-crystal Si layer adhered to a jig 112 by an adhesive 111 via a protective layer 106 is separated from the Si wafer 101 whose back side is adhered to a jig 110 by an adhesive 109 by pulling the jigs 112 and 110 in the opposite directions to mechanically destroy a porous Si layer as the separation layer. This publication also discloses that the jig 110 is removed from the Si wafer 101 to which the jig is adhered by an adhesive 109, and the Si wafer 101 is reclaimed for recycle. However, it is necessary for the adhesive 109 to fast adhere the Si wafer 101 to the jig 110, in order to transfer a high tensile force to the porous Si layer 102 in a separation step, which makes it difficult to later remove the jig 110 from the Si wafer 101. In other words, it is difficult to completely remove the adhesive 109 from the Si wafer 101, and the Si wafer may be damaged during the removal step.

SUMMARY OF THE INVENTION

It is an object of the present invention to provide a separation method of semiconductor layer which fast supports the layers during the separation step, allows them to be easily separated from the jigs after the separation step, and brings about advantages, e.g., prevention of damages of the substrate, to facilitate the subsequent steps. It is another object of the present invention to provide a production method of a solar cell using the above separation method.

The inventors of the present invention have intensively studied in order to solve the above problems and accomplished the following inventions. The first separation method of a semiconductor layer according to the present invention is a method for separating a semiconductor layer and a semiconductor substrate which supports the semiconductor layer from each other at a separation layer formed between them, wherein a face of the substrate at a side opposite to a separation layer is held by utilizing an ice layer. The second separation method of a semiconductor layer according to the present invention is a method for separating a semiconductor layer and a semiconductor substrate which supports the semiconductor layer from each other at a separation layer formed between them, wherein a face of the semiconductor layer at a side opposite to a separation layer is held by utilizing an ice layer. These two inventions may be effected simultaneously. The production method of a solar cell according to the present invention comprises using the semiconductor layer separated by the above-mentioned separation method as a photoactive layer for solar cells.

The separation method of the present invention is characterized in that the ice layer is used not only for holding the semiconductor layer or the semiconductor substrate, but also for cooling the separation layer and positively imparting stresses due to expansion or contraction to the substrate, the separation layer and the semiconductor layer, thereby uniformly breaking them, or cooling the separation layer to decrease its strength. This allows the semiconductor layer and the substrate to be more easily and uniformly separated from each other.

The above effects is more remarkably exhibited, when a porous layer is used as the separation layer. A porous layer used as the separation layer is required (1) to be easily separated, i.e., to have a fragile structure, and (2) to stably have a strength prior to the separation step, which tend to run counter to each other when the semiconductor layer is not surely supported by the porous layer prior to the separation step, problems may occur. For example, they may be separated from each other while a device is assembled, to possibly produce defective products. On the other hand, when the semiconductor layer is supported by the porous layer with a excessive force, the semiconductor layer may not be easily separated during the separation step, or the separated semiconductor layer may be cracked. It is therefore necessary for the porous layer to have an adequate strength, but controlling its strength is not easy.

The separation method of the present invention utilizing ice to hold the semiconductor layer or the substrate during the separation step cools the porous layer to decrease its strength, thereby simultaneously achieving stability of the porous layer prior to the separation step and easiness of its separation during the separation step.

The porous layer is held preferably at −5° C. or lower, and more preferably −21° C. or lower in order to easily carry out separation. At the same time, the holding temperature is preferably −220° C. or higher, in order to prevent loss of strength of the semiconductor substrate and the semiconductor layer.

In this invention, it is preferable that the substrate which supports the semiconductor layer is a Si wafer; the separation layer is a porous Si layer prepared by anodizing a Si wafer, the semiconductor layer is a single-crystal Si layer epitaxially grown on the porous Si layer; and a holding means is closely adhered to the ice layer. For the holding means, a flexible, film-like substrate or hard substrate is suitably used. It may be an ice plate made of ice itself, or a porous spacer which adsorbs water. The holding means may be provided with a cooling mechanism inside. The semiconductor layer may be adhered to a supporting substrate of different thermal expansion coefficient, the semiconductor substrate may be held while cooling the semiconductor substrate, and the difference in thermal expansion coefficient may be utilized to carry out separation.

It is preferable to produce a solar cell using the semiconductor layer, separated by the method of the present invention, as the active layer for the cell. In addition, the semiconductor layer may be used as the active layer for general semiconductor devices, e.g., sensors and liquid-crystal displays.

BRIEF DESCRIPTION OF THE DRAWINGS

FIGS. 7A, 7B and 7C are schematic sections showing the production steps of Embodiment 3 of the present invention;

FIGS. 10A, 10B, 10C, 10D, 10E and 10F are schematic sections showing the production steps of Embodiment 5 of the present invention;

DESCRIPTION OF PREFERRED EMBODIMENTS

A production method of a solar cell, which uses a separation method of the present invention, will be described as some of preferred embodiments of the present invention. The separation method of the present invention is applicable to production of a semiconductor device other than a solar cell.

Embodiment 1

Embodiment 1 will be described the production steps of a solar cell, which is obtained by forming a porous Si layer on a Si wafer by anodization; depositing single-crystal Si layers on the porous Si layer by an apparatus for liquid-phase growth; forming grid electrodes; and peeling off the single-crystal Si layers, and which has a structure that the single-crystal Si layers of the solar cell produced are irradiated with light from the surface side on which the epitaxial growth of the Si layer is stopped (grid electrode side).

Figure 1A:
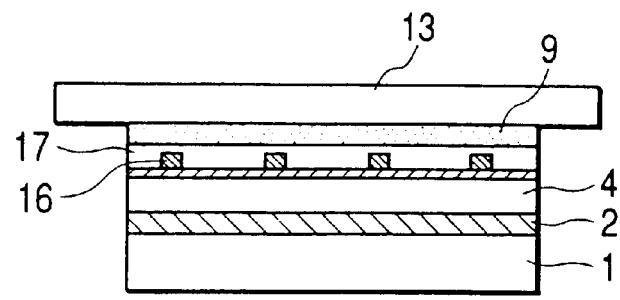
FIGS. 1A, 1B and 1C are schematic sections showing the production steps of Embodiment 1 of the present invention.
Figure 1B:
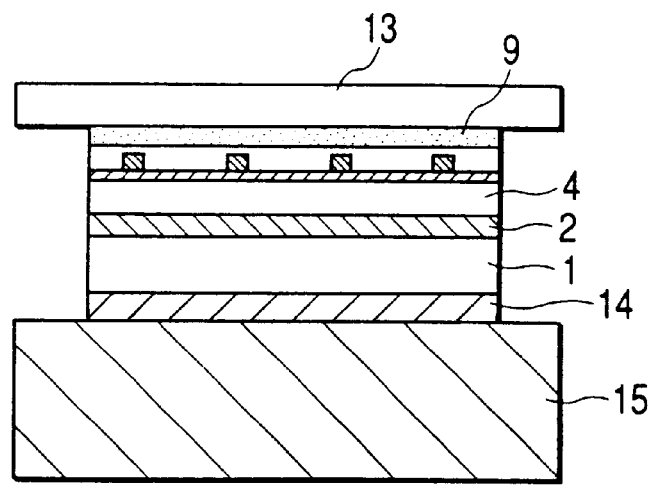
Figure 18A:
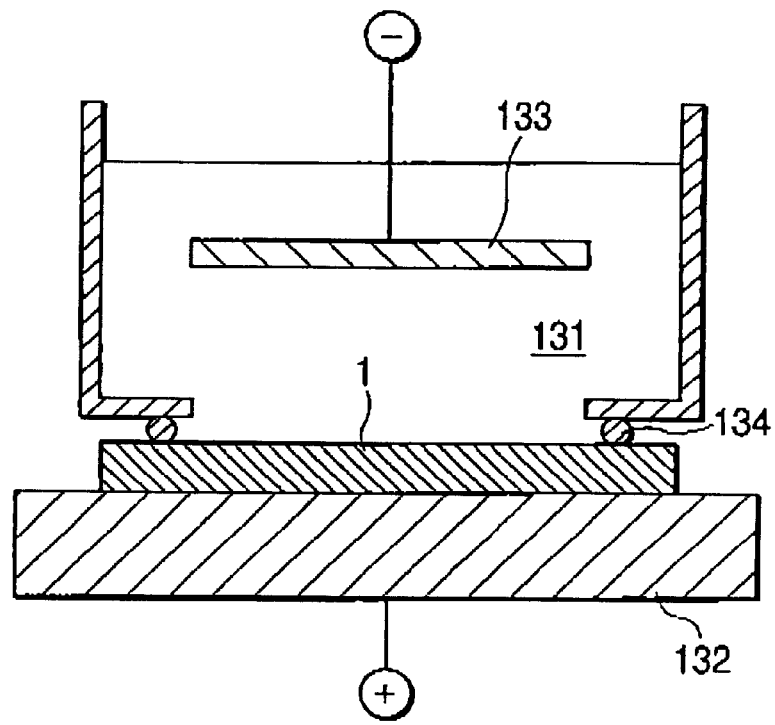
FIGS. 18A and 18B are sections showing an anodization apparatuses.
Figure 18B:
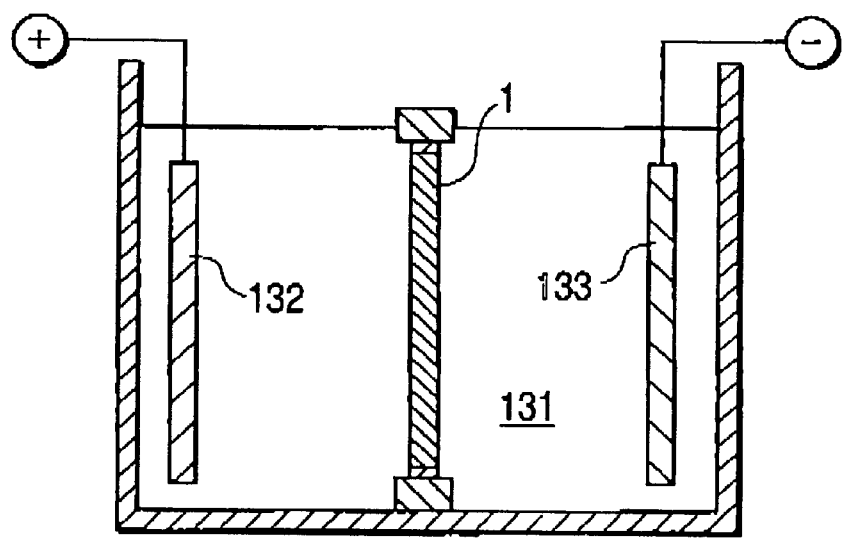

FIGS. 1A to 1C through 3A to 3C show the schematic sections illustrating the production steps of the production method of a thin-film single-crystal Si solar cell according to Embodiment 1 of the present invention. First, the Si wafer 1 is prepared (FIG. 2A). Then, the Si wafer 1 is anodized to form the porous Si layer 2 thereon (FIG. 2B). FIGS. 18A and 18B show the sections illustrating apparatuses for anodizing the Si wafer 1 in a hydrofluoric acid-based etchant, where numeral 1 denotes Si wafer, 131: etchant of hydrofluoric acid, 132 and 133: metallic electrodes, and 134: O-ring. The Si wafer to be anodized is preferably of p type, but n type is acceptable when it is low in resistance. Even the normal n-type wafer can be made porous, when it is in a state of generating holes by light irradiation. As shown in FIG. 18A, a voltage is applied between the lower metallic electrode 132 and the upper metallic electrode 133 to make the electrodes 132 and 133 positive and negative, respectively, in such a way to orient the resultant electrical field in the direction perpendicular to the face of the Si wafer 1. The Si wafer 1 is made porous on the upper side. The hydrofluoric acid-based etchant 131 is preferably concentrated hydrofluoric acid (49% HF). Bubbles are formed from the Si wafer during the anodization step, and it is preferable to add alcohol as a surfactant to the etchant to efficiently remove these bubbles. The preferable alcohol is methanol, ethanol, propanol or isopropanol. Use of the surfactant may be replaced by agitation using an agitator. The anodization may be carried out while agitating the etchant. The porous layer preferably has a thickness of 1 to 30 µm.

A preferable example of anodization will be described below, which can be applied to the present invention.

The Si wafer 1 of p-type having a low resistivity (0.01 to 0.02 Ωcm) is set in the anodization apparatus filled with a 10:1 mixture of concentrated HF (49%) and water. A voltage is applied between the electrodes to pass current at a current density of, e.g., 8 mA/cm$^2$ for 10 minutes, and then the current density is sharply changed to, e.g., 20 mA/cm$^2$ for about 5 minutes while continuing voltage application. As a result, the porous Si layer 2 is formed on the Si wafer 1, as shown in FIG. 2B.

Figure 19:
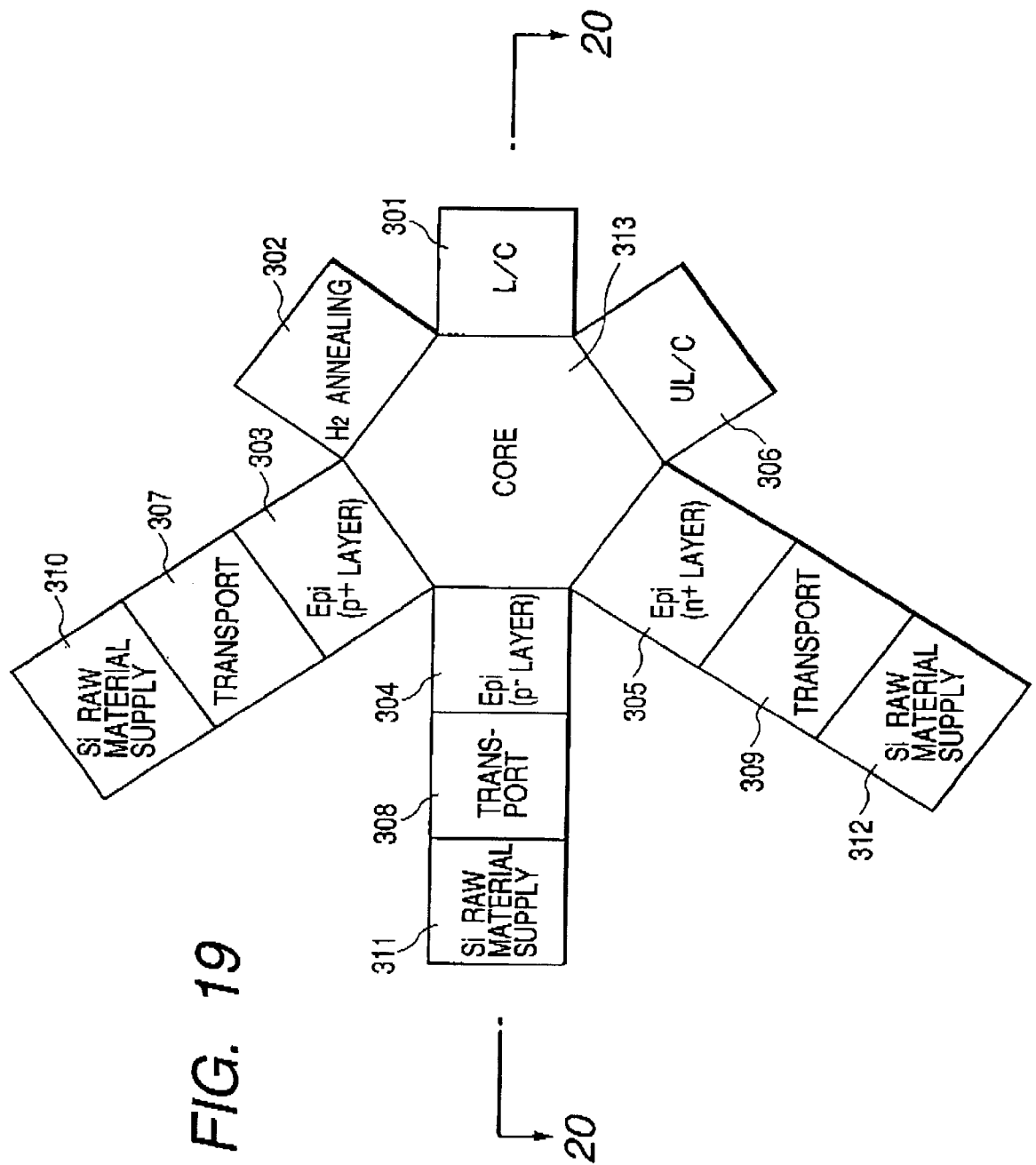
FIG. 19 is a plan view of a 3-tank type apparatus for liquid-phase growth.

Next, the substrate shown in FIG. 2B is set in the apparatus for liquid-phase growth, to epitaxially grow a p$^+$ type single-crystal Si layer thereon. Herein, an apparatus for liquid-phase growth of a dipping type, which is used in such a process, is schematically shown. FIG. 19 shows a plan view seen from the top of the 3-tank type apparatus for liquid-phase growth used for the above purpose. In FIG. 19, numeral 301 denotes loading chamber (L/C), 302: hydrogen annealing chamber, 303: chamber in which the p$^+$ type single-crystal Si layer is grown, 304: chamber in which the p$^-$ type single-crystal Si layer is grown, 305: chamber in which the n$^+$ type single-crystal Si layer is grown, 306: unloading chamber (L/C), 313: core which contains the transport system for the substrate cassette, 307, 308 and 309: transport chambers for transporting the Si raw material to the chambers in which the p$^+$ type single-crystal Si layer, p$^-$ type single-crystal Si layer and n$^+$ type single-crystal Si layer are grown, respectively; and 310, 311 and 312: chambers for storing the Si raw material to be supplied to the chambers in which the p$^+$ type single-crystal Si layer, p$^-$ type single-crystal Si layer and n$^+$ type single-crystal Si layer are grown, respectively.

For the liquid-phase growth, the substrate cassette of the Si wafer 1 having the porous Si layer 2 thereon is set in the loading chamber (L/C) 301. It is then transported from the loading chamber (L/C) 301 by the transport system contained in the core 313 to the hydrogen annealing chamber 302, where the substrate cassette is annealed with hydrogen. Then, the substrate cassette is transported to, e.g., the chambers 303, 304 and 305 in which the respective p$^+$ type single-crystal Si layer, p$^-$ type single-crystal Si layer and n+type single-crystal Si layer are grown, in this order, to form the p$^+$ type single-crystal Si layer, p$^-$ type single-crystal Si layer 4 and n$^+$ type single-crystal Si layer 5 on the porous Si layer 2.

Figure 20:
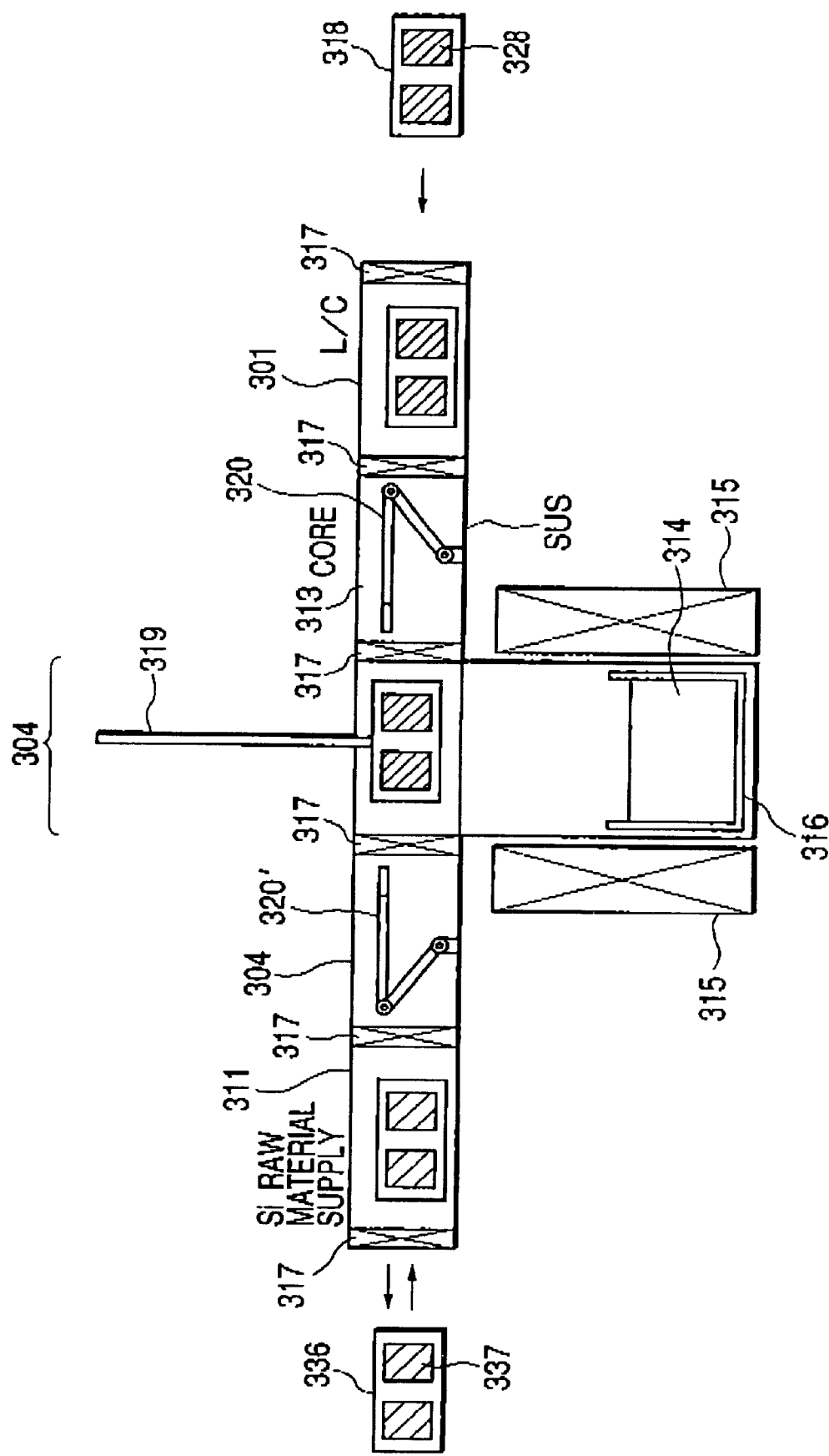
FIG. 20 is a section of a 3-tank type apparatus for liquid-phase growth.
Figure 21:
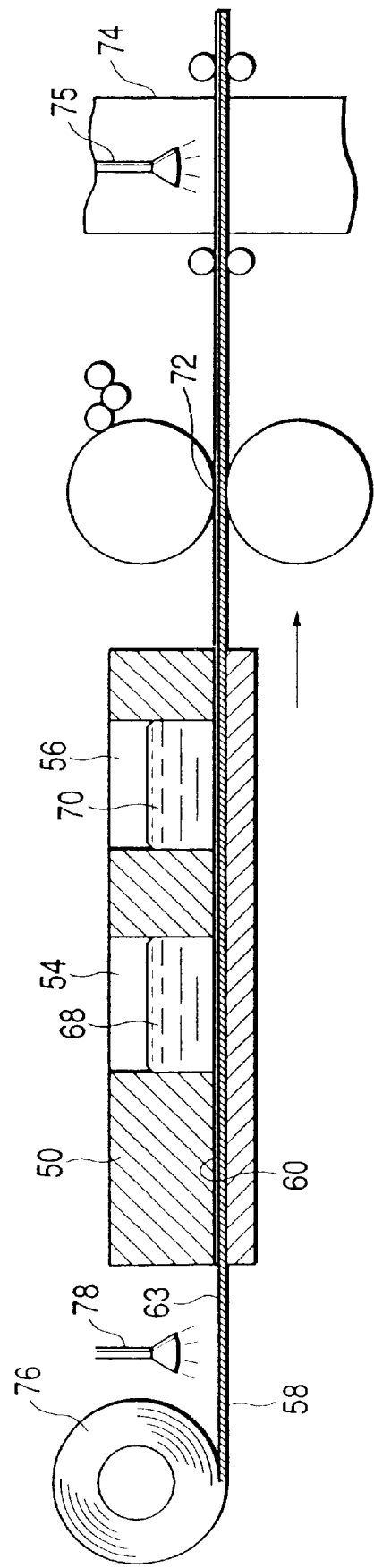
FIG. 21 is a section of a conventional apparatus for liquid-phase growth.
Figure 22:
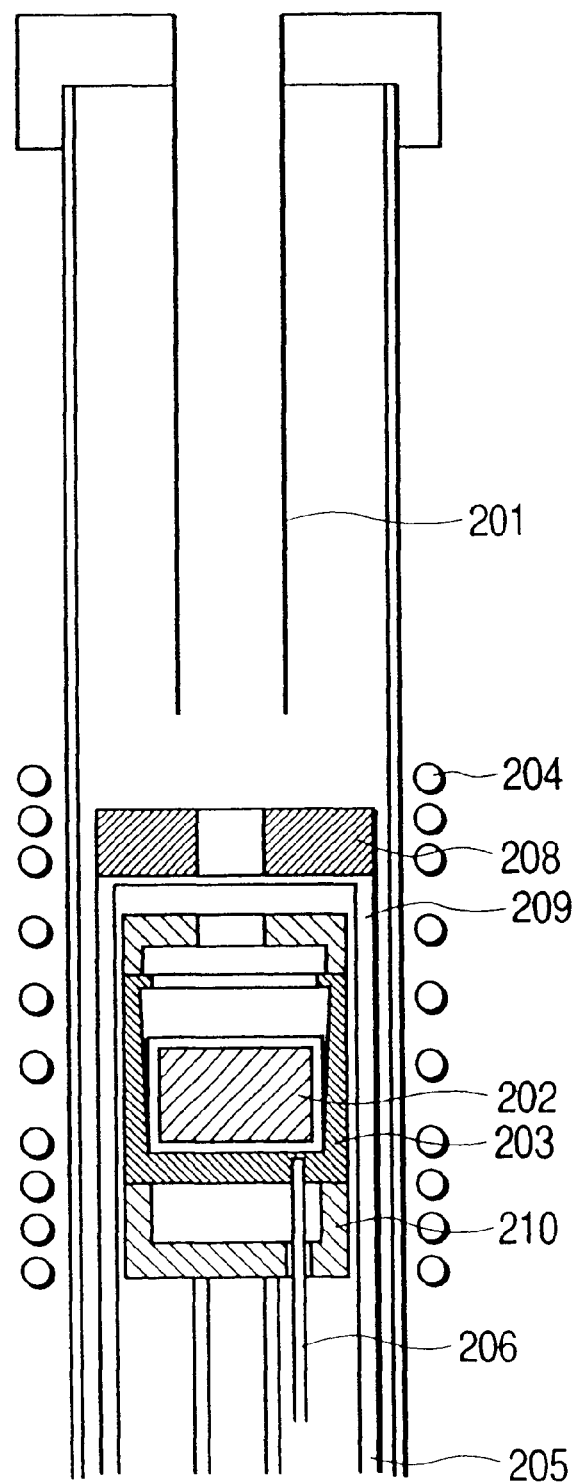
FIG. 22 is a section of another conventional apparatus for liquid-phase growth.
Figure 23:
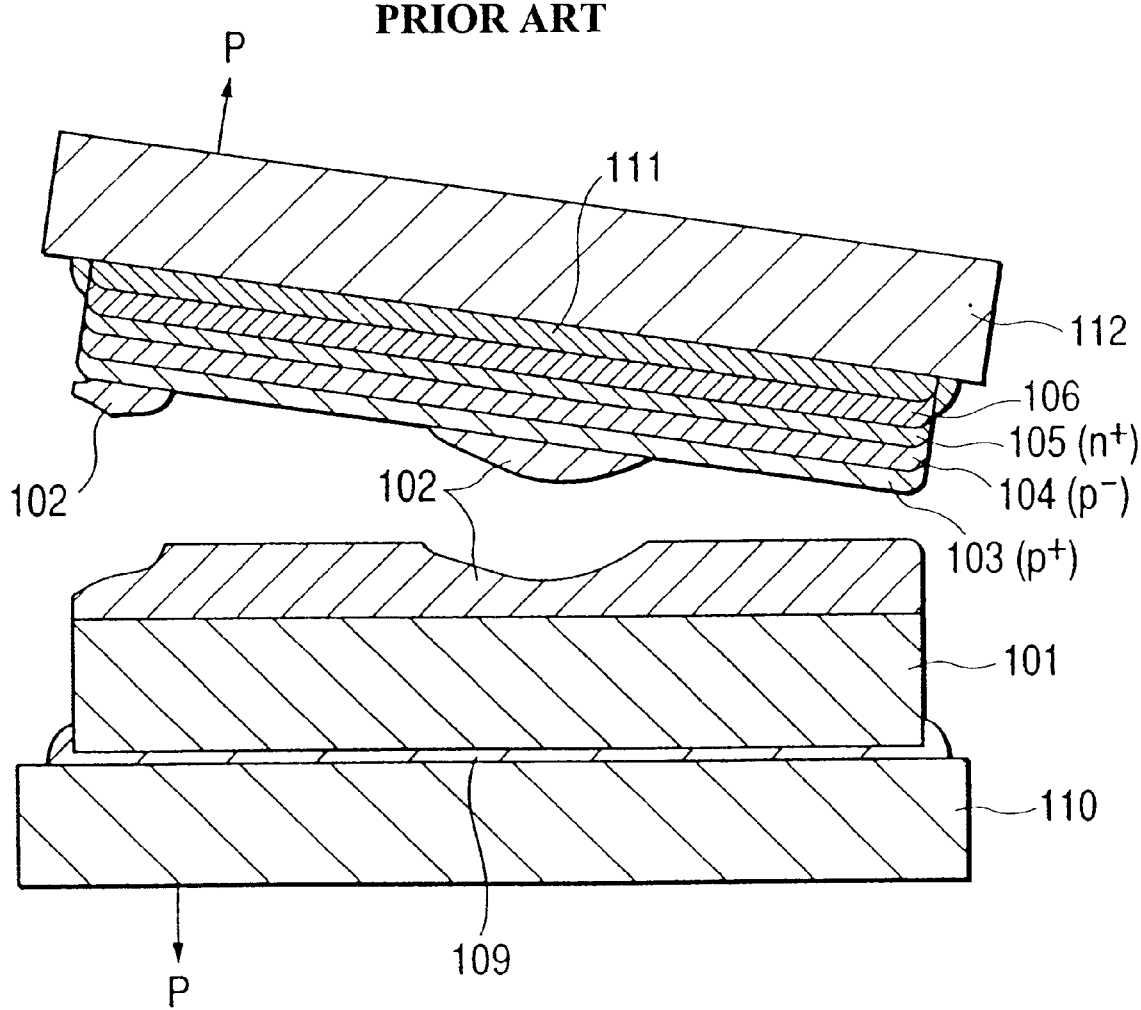
FIG. 23 is a section illustrating a conventional process of manufacturing solar cells.

FIG. 20 shows a sectional view of the 3-tank type apparatus for liquid-phase growth, taken along the line 20—20 of FIG. 19. In FIG. 20, numeral 314 denotes solvent, 315: heater, 316: crucible, 317: gate valve, 318: wafer cassette, 319: vertical transport system, 320 and 320': horizontal transport systems, 336: substrate cassette for melting the substrate, and 337: substrate to be molten. Those members marked with the same numbers as described above have the same functions and are omitted for their description. The loading chamber 301 is normally separated from the core 313 and external atmosphere by the gate valves 317. The wafer cassette 318 can be set in the loading chamber 301 after opening the gate valve 317 at the right of the chamber 301. The wafer cassette 318 can be transported to the chamber 304 in which the p$^-$ type single-crystal Si layer is grown by the horizontal transport system 320 in the core 313 after opening the gate valve 317 at the left of the loading chamber 301.

The chamber 311 for storing the Si raw material takes the substrate cassette 336 for melting the substrate in and out after opening the left-side gate valve 317. The substrate cassette 336 for melting the substrate is transported, by means of the horizontal transport system 320' in the transport chamber 308 after opening the right-side gate valve 317, to the chamber 304 in which the p$^-$ type single-crystal Si layer is grown. The chamber 304 in which the p$^-$ type single-crystal Si layer is grown is provided with the vertical transport system 319 which moves the wafer cassette 318 or the substrate cassette 336 for melting the substrate in the vertical direction. The vertical transport system 319 dips the wafer cassette 318 or substrate cassette 336 for melting the substrate in the solvent 314 held in the crucible 316. The solvent 314 is heated by the heater 315 to a sufficiently high temperature to be kept liquid. The sectional view of the chamber 303 in which the p⁺ type single-crystal Si layer is grown, the transport chamber 307, the chamber 310 for storing the Si raw material, and the sectional view of the chamber 305 in which the n⁺ type single-crystal Si layer is grown, the transport chamber 309, and the chamber 312 for storing the Si raw material have the same structures as those shown in FIG. 20, Formation of the layers by the above apparatus for liquid-phase growth is described more concretely The wafer cassette 308, holding the p-type Si wafer 328 formed the porous Si layer 2 thereon under the above-described conditions, was transported to the hydrogen annealing chamber 302, where the cassette 308 was heated to 1100° C. in a hydrogen atmosphere, at this temperature it was annealed with hydrogen for 1 min. On completion of the annealing step, silane ($SiH_4$) gas may be passed through the chamber, to keep the surface of the porous Si layer 2 under the conditions suitable for further growth.

Next, the wafer cassette 318 was transported to the chamber 303 for growing the p⁺ type single-crystal Si layer therein, where the p⁺ type single-crystal Si layer (not shown) was formed on the porous Si layer 2 shown in FIG. 2B. Indium was used as a solvent, in which the p⁻ type Si substrate to be molten as the raw material and a dopant in a quantity necessary to produce the p⁺ type Si layer were previously dissolved before the growth step. It was held at a constant temperature of 960° C. to keep the solution saturated. Then, the substrate and solvent were slowly cooled to keep the solution supersaturated to some extent. At this stage, the solvent was brought into contact with the surface of the substrate shown in FIG. 2B and the solvent was slowly cooled. The p⁺ type single-crystal Si layer was grown on the porous Si layer 2. The growth conditions were the solvent temperature of 950° C. decreased to 940° C., the slowly cooling rate of 1° C./min, and the dipping time (growth time) of approximately 10 minutes. Approximately 10 μm thick p⁺ type single-crystal Si layer was grown. It is for the back surface field (BSF) effect, and may not be necessary.

Figure 2A:
FIGS. 2A, 2B, 2C, 2D and 2E are schematic sections showing the production steps of Embodiment 1 of the present invention.
Figure 2B:
Figure 2C:
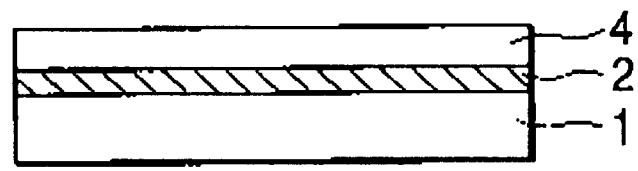

Next, the wafer cassette 318 was transported, via the core 313, to the chamber 304 for growing the p⁻ type single-crystal Si layer therein. The p⁻ type Si substrate as the one to be molten was dissolved in the solvent and the p⁻ type single-crystal Si layer was grown by the liquid-phase growth, in a manner similar to the one described above. The dipping time was approximately 30 minutes, and the p⁻ type single-crystal Si layer having a thickness of approximately 30 μm was grown (FIG. 2C).

Figure 2D:
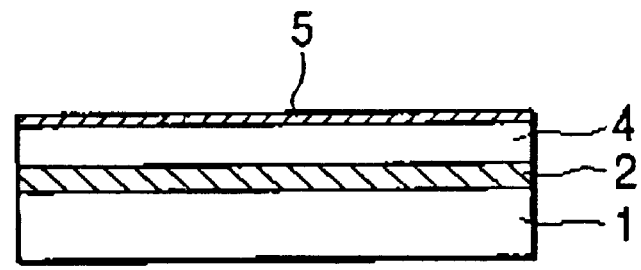

Similarly, the wafer cassette 318 is transported to the chamber 305 in which the n⁺ type single-crystal Si layer is grown, where the n⁺ type Si substrate as the one to be molten is dissolved in the solvent beforehand. The n⁺ type single-crystal Si layer 5 is similarly grown by the liquid-phase growth to have a thickness of 0.2 to 0.3 μm (FIG. 2D). The wafer cassette 318 after forming the p⁺ type single-crystal Si layer, p⁻ type single-crystal Si layer 4 and n⁺ type single-crystal Si layer 5 is withdrawn from the apparatus for liquid-phase growth.

Figure 2E:
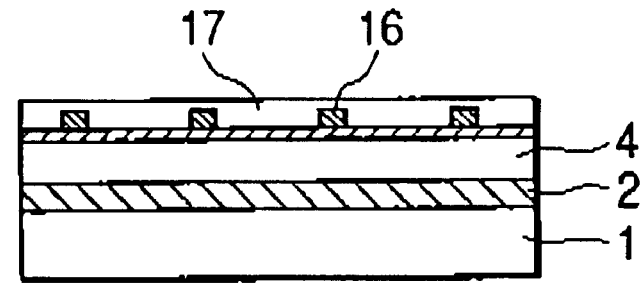

Next, a grid electrode 16 was formed on the n⁺ type single-crystal Si layer 5 by an adequate method, e.g., printing, and then the antireflection layer 17 was formed on the grid electrode 16 and the n⁺ type single-crystal Si layer 5 (FIG. 2E). After a light-transmittable adhesive 9 was applied onto the antireflection layer, the light-transmittable supporting substrate 13 was bonded to the light-transmittable adhesive 9 spread over the antireflection layer 17, and the adhesive is cured to strongly adhere them to each other (FIG. 1A). It is preferable that the supporting substrate 13 is greatly different from Si in thermal expansion coefficient. Glass and common plastic materials such as polycarbonate and polyethylene terephthalate can be used for the supporting substrate.

Next, the thin films for forming the solar cell were separated from the Si wafer at the porous Si layer. This process depends on the porous Si layer having a number of voids therein, which make it inferior to the Si wafer and Si layer grown in the liquid phase in mechanical strengths such as tensile, compression and shear strengths. Water was sprayed by a sprayer over the Si wafer on the back side to form a water layer. It was set on the supporting table 15 as the holding means, and the whole substrate and the supporting table 15 were cooled. The water layer became the ice layer 14 when the whole system reached 0° C. or lower, and the substrate was strongly adhered to the table (FIG. 1B).

The supporting substrate 13 and Si wafer 1 have different shrinkage coefficients (the plastic material used for the supporting substrate 13 generally has a shrinkage coefficient larger than that of the Si wafer, because of difference between them in thermal expansion coefficient. However, the stress resulting from the different shrinkage coefficient is not large enough to destroy the porous Si layer 2, and no separation occurs in this stage.

Figure 1C:
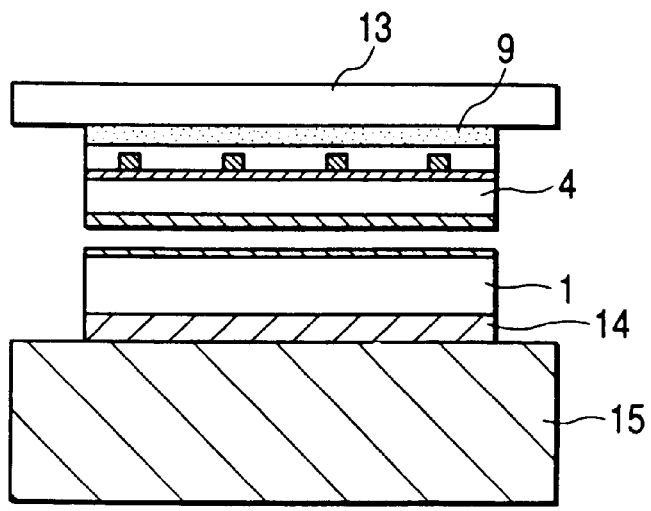
Figure 3A:
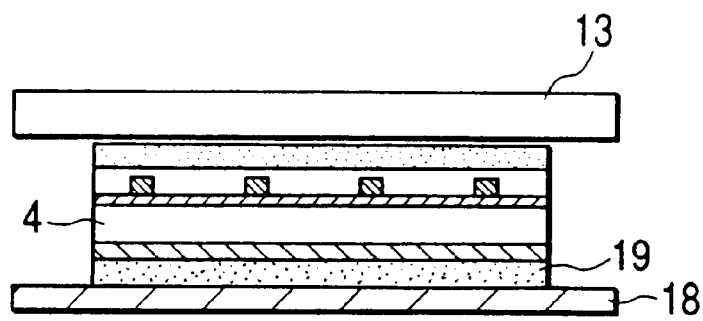
FIGS. 3A, 3B and 3C are schematic sections showing the production steps of Embodiment 1 of the present invention.
Figure 3B:
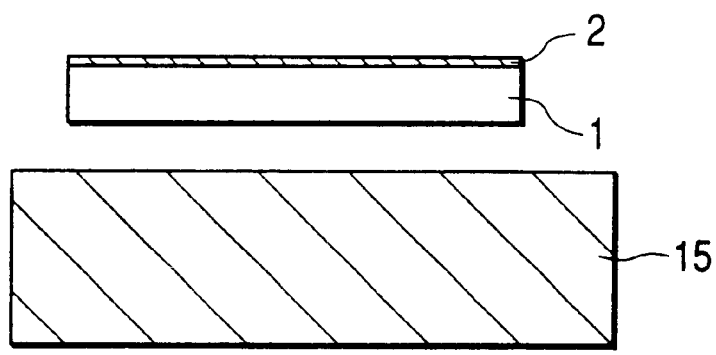

Decreasing temperature further to −20° C. increased stress in the porous Si layer 2 to a sufficient level to destroy the layer, and the single-crystal Si layers 4 and 5 were separated from the Si wafer 1 (FIG. 1C). These separated layers were set on the electroconductive substrate 18 (e.g., of stainless steel) via the electroconductive adhesive 19 spread on the under surface of the broken porous Si layer 2, to form the solar cell unit of thin-film, single-crystal Si (FIG. 3A).

The solar cell unit of thin-film, single-crystal Si thus prepared was tested by an AM1.5 solar simulator. It showed the conversion efficiency of 14.3%.

Figure 3C:
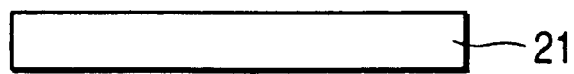

The Si wafer 1 separated from the single-crystal Si layers 4 and 5 was heated and removed from the supporting table 15 (FIG. 3B), and immersed in an alkaline etchant to remove the residual porous Si layer, to reclaim the Si wafer 21 (FIG. 3C). It is found that the reclaimed Si wafer 21 can be repeatedly used by forming a porous Si layer thereon.

The method of Embodiment 1 needs neither a special apparatus such as a vacuum adsorption mechanism for holding the Si wafer 1 nor an adhesive to adhere the Si wafer to the supporting table 15. It can be held securely only by providing a water layer on the back side of the Si wafer 1 or on the supporting table 15.

The method for destroying the porous Si layer by utilizing difference between the Si wafer and the supporting substrate in thermal expansion coefficient generates a stress due to the one side shrinking larger than the other. The Si wafer and the supporting substrate will bend unless the one side is held, to relax the stress. The present method of Embodiment 1 causes no bending, but efficiently generates a stress in the porous Si layer by the difference between them in thermal expansion coefficient.

The Si wafer 1 can be easily removed from the supporting table 15 leaving nothing behind by heating them back to room temperature, after the single-crystal Si layers are peeled off.

Embodiment 2

Embodiment 2 will be described the production steps of a solar cell, the solar cell produced being irradiated with light from the single-crystal Si layer on the surface side on which the epitaxial growth of the Si layer is stopped (grid electrode side). FIGS. 4A to 4F through 5A to 5E show the schematic sections illustrating the production steps of Embodiment 2.

Figure 4A:
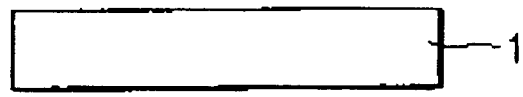
FIGS. 4A, 4B, 4C, 4D, 4E and 4F are schematic sections showing the production steps of Embodiment 2 of the present invention.
Figure 4B:
Figure 4C:
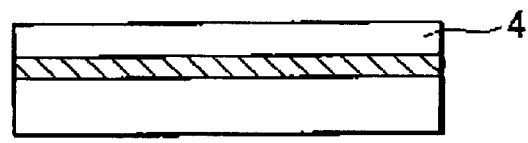

The $p^+$ type Si wafer 1 (FIG. 4A) was anodized with a solution obtained by adding isopropyl alcohol to hydrofluoric acid at 1/10 vol. % to form a 5 μm thick porous Si layer 2 (FIG. 4B) thereon. The Si wafer 1 was set in the load lock chamber in the apparatus for liquid-phase growth. The load lock chamber was evacuated under a vacuum and filled with a hydrogen gas. Then, the gate valve leading to the growth chamber was opened, to transport the substrate into the growth chamber. It was annealed at about 1050° C., cooled to 950° C., and dipped in the indium solvent supersaturated beforehand with Si. The solvent was then cooled at 1° C./min and the $p^-$ type single-crystal Si layer 4 was grown on the porous Si layer 2 on the wafer from the indium solvent to have a thickness of about 30 μm in 30 minutes (FIG. 4C).

Figure 4D:
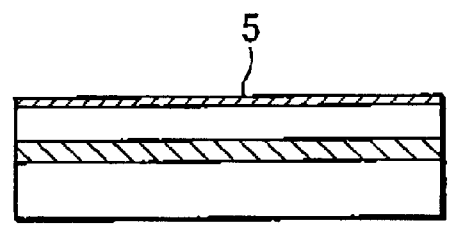
Figure 4E:
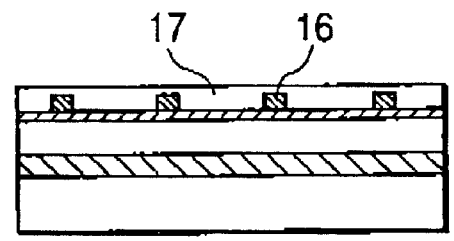

The grown Si layer was coated with an n-type dopant dispersing agent containing phosphorus by a spin coater, and treated at 900° C. in a nitrogen atmosphere for 30 min, to disperse phosphorus under heat, thereby forming the $n^+$ type single-crystal Si layer 5 (FIG. 4D). The surface was printed with a comb-shaped pattern of silver paste by a screen printer, and sintered in a sintering furnace at 600° C. for 30 min, to form the grid electrode 16 It was then coated with a solution of titanium oxide by a spin coater, and sintered at 600° C. for 30 min, to form the antireflection layer 17 consisting of titanium oxide (FIG. 4E).

Figure 4F:
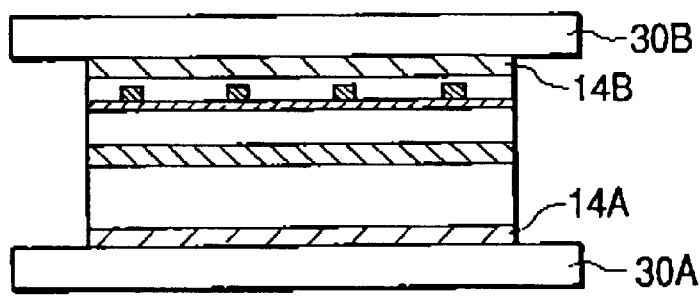
Figure 5A:
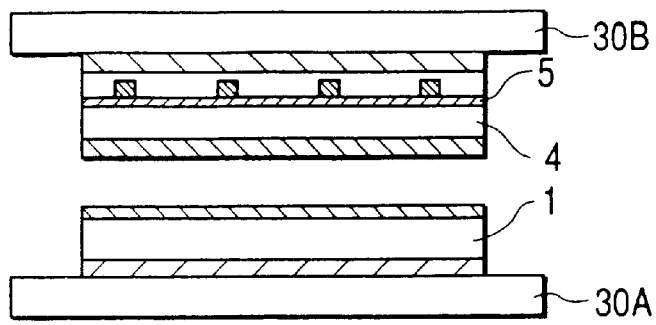
FIGS. 5A, 5B, 5C, 5D and 5E are schematic sections showing the production steps of Embodiment 2 of the present invention.
Figure 5B:
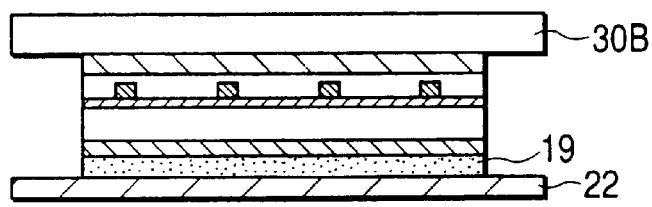

Water was sprayed by a sprayer onto the surface of the antireflection layer 17 and back side of the Si wafer 1, kept at 5° C., to form thin water layers thereon. The holding substrate 30A, a 1 mm thick stainless steel plate as the holding means, was pressed to the back side of the Si wafer 1, and the similar holding substrate 30B to the surface of the antireflectlon layer 17, both substrates being kept at −10° C. The water layers were instantaneously frozen to form the ice layers 14A and 14B, to strongly adhere the holding substrates 30A and 30B to the wafer 1 and antireflection layer 17, respectively (FIG. 4F). A force was applied to the holding substrates 30A and 30B in such a way to separate them from each other, while keeping the whole system at −10° C. As a result, the porous Si layer 2, having a number of voids and hence more fragile, was broken to separate the single-crystal Si layers 4 and 5 from the Si wafer 1 (FIG. 5A).

Figure 5C:
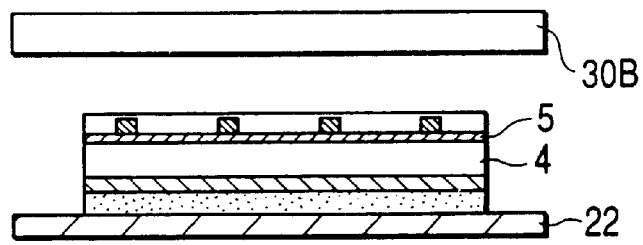
Figure 5D:
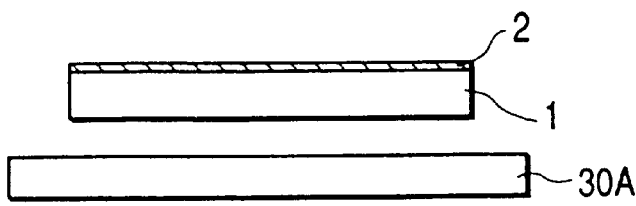

The 0.15 mm thick stainless steel back-surface electrode 22 was separately coated with aluminum paste as the electroconductive adhesive 19 by screen printing. The back side of the single-crystal Si layer 4, separated from the Si wafer 1, was pressed to the adhesive-coated surface of the electrode 22 (FIG. 5B), and the assembly is heated. The holding substrate 30B came off the antireflection layer 17, as a result (FIG. 5C). The assembly of the back-surface electrode and single-crystal Si layer, separated from the holding substrate 30B, was heated in a sintering furnace at 600° C. for 30 min. The aluminum paste was sintered to strongly adhere the Si layer to the back-surface electrode. At the same time, aluminum is dispersed in the back side of the $p^-$ type single-crystal Si layer, to form a back surface field. The solar cell of thin-film, single-crystal Si thus prepared was tested by an AM1.5 solar simulator. It showed a conversion efficiency of 14.1%.

Figure 5E:
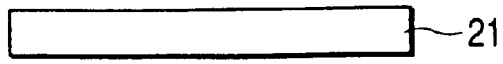

The Si wafer 1 separated from the single-crystal Si layers 4 and 5 was heated to remove the holding substrate 30A (FIG. 5D), and immersed in an alkaline etchant to remove the residual porous Si layer 2 in the surface (FIG. 5E). The Si wafer thus reclaimed (Si wafer 21) was again treated similarly as in the above manners including formation of a porous Si layer for reuse. It was found to be reused 10 times.

The method of Embodiment 2 needs no adhesive which is expensive to conduct adhesive bonding of the holding substrate. After the Si layers are peeled off, the residue is easily removed leaving nothing behind. Unlike the case with a residual resin-based adhesive, a high temperature treatment such as aluminum paste sintering can be carried out after the peeling-off step. The holding substrate for peeling off the Si layers can be reused, to reduce the production cost, even when it is expensive. Unlike Embodiment 1, light transmittance is not a consideration for selecting the holding substrate 30B material.

Embodiment 3

Figure 6A:
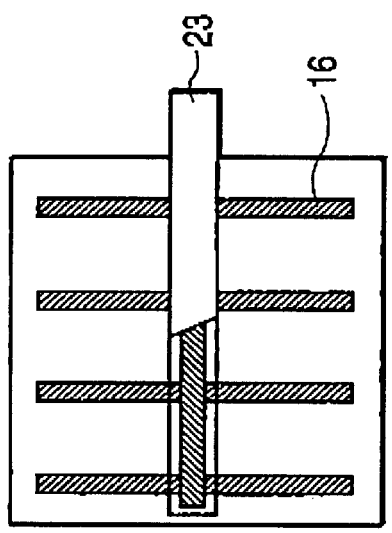
FIGS. 6A, 6B and 6C are a schematic plan view and schematic sections showing the production steps of Embodiment 3 of the present invention.
Figure 6B:
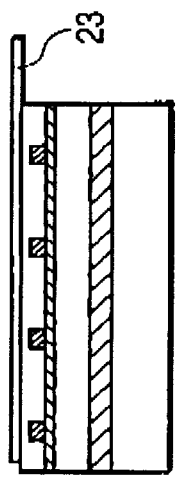

Embodiment 3 will be described production of a solar cell module with 3 solar cells (unit cell) connected in series, for which the production method of a solar cell of Embodiment 2 is efficiently used. FIGS. 6A to 6C through 9 illustrate production steps for a solar cell module of Embodiment 3, FIG. 6A showing a schematic plan and the others schematic sectional views.

Figure 6C:
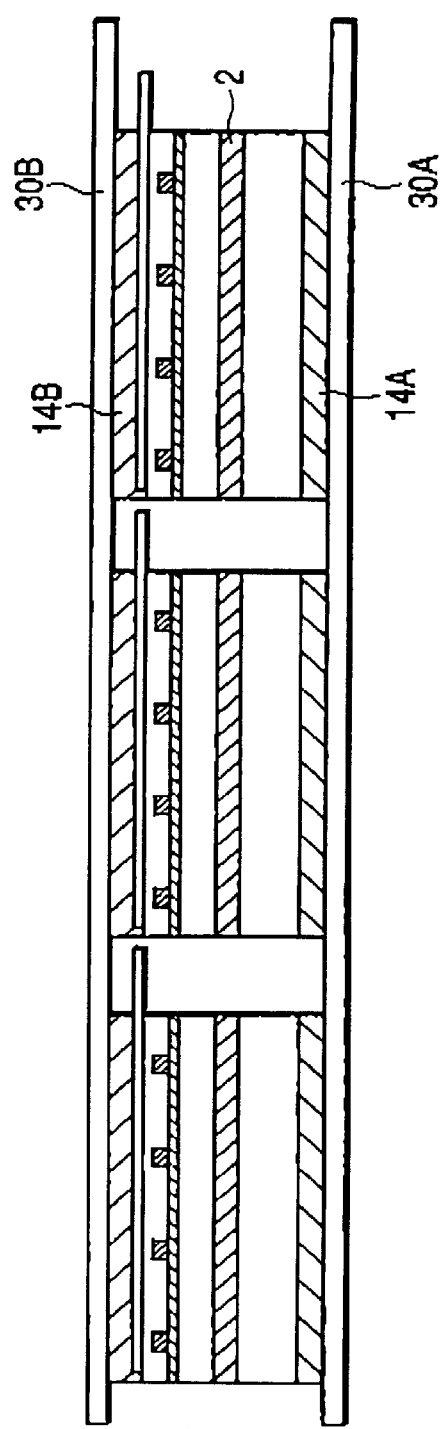

In Embodiment 3, openings were provided on a part of the grid electrode 16 in the step for forming the antireflection layer 17 (FIG. 4E for Embodiment 2). The electroconductive busbar 23 (e.g., nickel-plated copper tape) was adhered to the grid electrode 16 at the openings using an electroconductive adhesive (not shown), and sintered (FIG. 6A, and FIG. 6B as the sectional view thereof). Water was sprayed over the surface of the holding substrate 30A as the holding means kept at 5° C., to form a thin water layer thereon. The 3 unit cells thus prepared, kept at 5° C., were arranged on the holding substrate 30A in such a way that the busbars 23 were arranged in a straight line. Water was sprayed over the surfaces of the unit cells to form a thin water layer thereon, on which the holding substrate 30B kept at 5° C. was placed. Cooling the assembly to −10° C., while keeping a pressure thereon, freezes the water layers to have the ice layers 14A and 14B, which strongly adhere the unit cells to the holding substrates 30A and 30B (FIG. 6C).

Figure 8A:
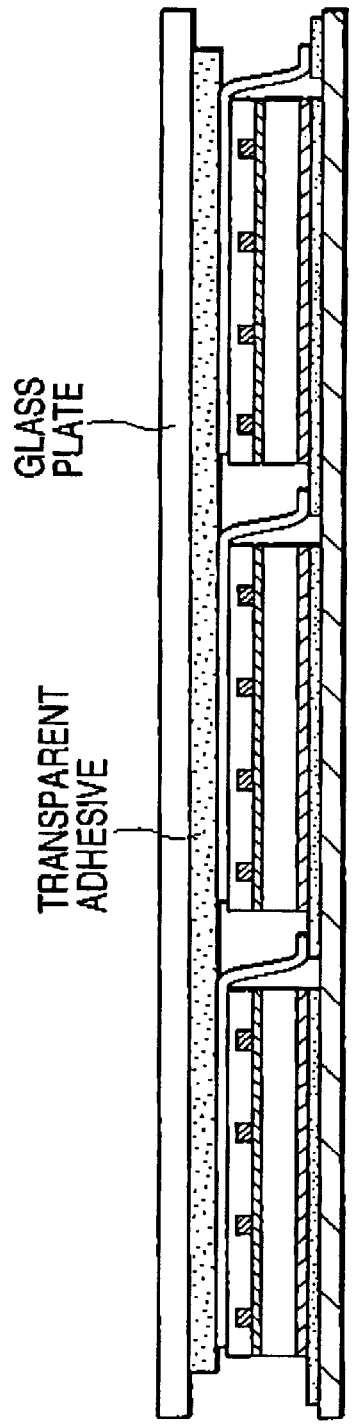
FIGS. 8A and 8B are schematic sections showing the production steps of Embodiment 3 of the present invention.
Figure 8B:
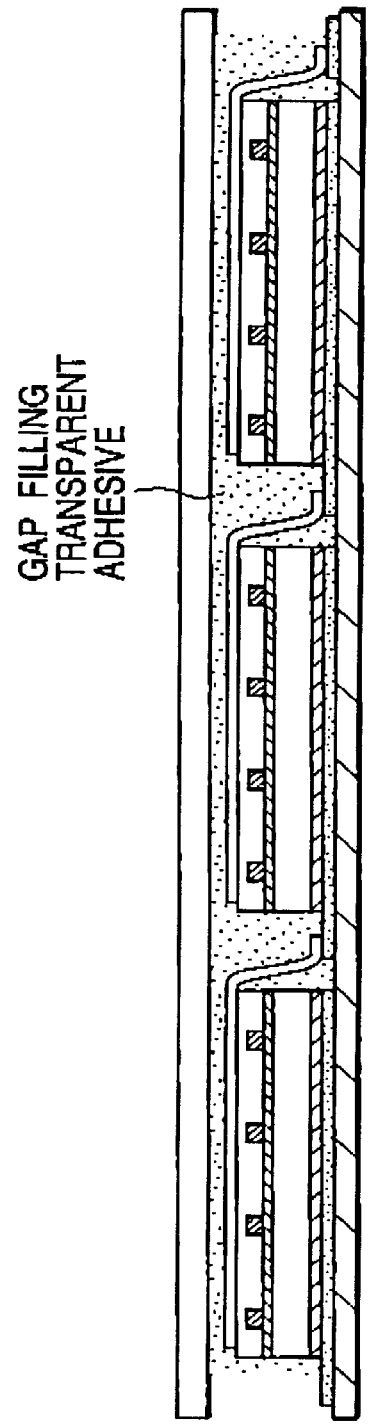

A force was applied to the holding substrates 30A and 30B in such a way to peel them off from each other under the above conditions. As a result, the single-crystal Si layers were peeled off at the porous Si layer 2 (FIG. 7A). Next, the back-surface electrode of stainless steel sheet was adhered to the ceramic backing plate 24 by an adhesive. The 3 unit cells were adhered to the surface of the back-surface electrode 22 by the electroconductive adhesive 19, while these cells were kept adhered to the holding substrate 30B (FIG. 7B). Increasing temperature of the assembly, while keeping pressure on the backing plate 24 and holding substrate 30B, allowed the holding substrate 30B to come off. The electroconductive adhesives of the unit cells were sintered while pressing the busbar 18 of one unit cell to the exposed portion of the electroconductive adhesive 19 of the adjacent unit cell (FIG. 7C), where 20 was the portion of the electroconductive adhesive to which the busbar was pressed. Then, a glass plate coated with a transparent adhesive on a given portion was pressed to the unit cell surfaces, and this assembly was heated at about 150° C. for 30 min. As a result, the transparent adhesive was molten to fill the gaps (FIG. 8B).

The solar cell module thus prepared generated the same output current as the unit cell, and 3 times higher output voltage than the unit cell. The 3 unit cells could be simultaneously treated (e.g., for peeling-off), thereby greatly increasing efficiency.

Embodiment 4

In Embodiment 4, a Si wafer was fixed on a Si wafer supporting member via an ice layer to peel off a thin-film semiconductor formed on the Si wafer.

Figure 9:
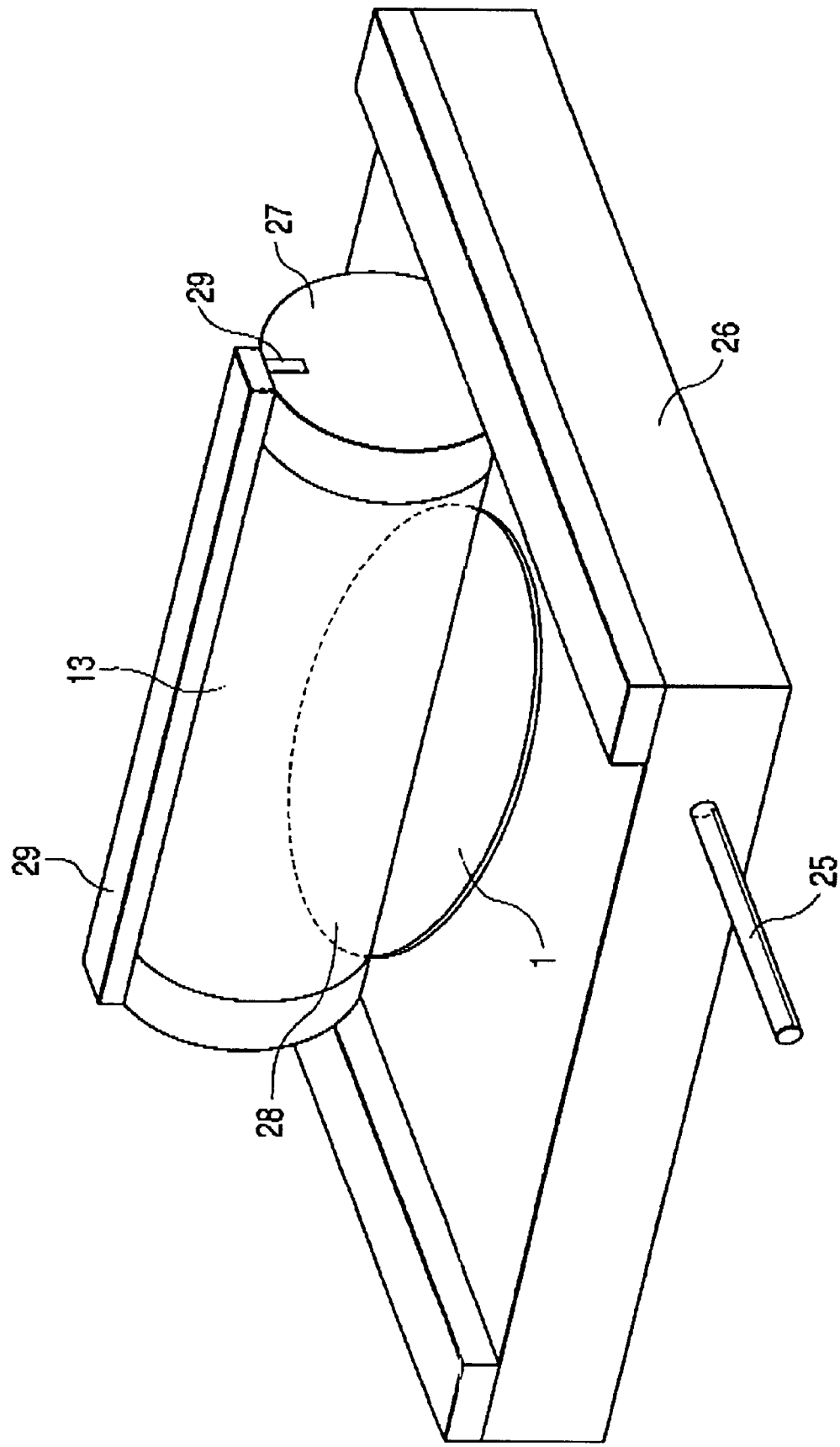
FIG. 9 is an oblique view showing a peeling apparatus used in Embodiment 4 of the present invention.

(1) In Embodiment 4, a separation layer was formed on the Si wafer 1, and the thin-film semiconductor 28 was further formed on the separation layer, like the above-described embodiments. The separation layer may be a porous Si layer formed by anodization on a Si wafer, or peeling-off layer formed by implanting H ions into a Si wafer and annealing it. Otherwise, the separation layer may be a graphite layer formed on a glass or metal substrate in place of Si wafer. The Si wafer 1 (or glass or metal substrate) thus prepared was fixed on the Si wafer supporting member 26 of the peeling apparatus of the present invention (FIG. 9).

(2) The Si wafer supporting member of the peeling apparatus used in Embodiment 4 has a cooling mechanism inside as the holding means, which cools the surface. One of the cooling mechanisms useful for the present invention is equipped with the tube 25 of a metal (e.g., aluminum) through which a refrigerant (e.g., liquid nitrogen) is flown, and set in the Si wafer supporting member 26. Another mechanism uses dry ice, which is in contact with the back side of the Si wafer supporting member 26. Water was sprayed over the surface of the Si wafer supporting member 26, equipped with the cooling mechanism, on which the Si wafer 1 was placed. When the Si wafer supporting member 26 was cooled by its cooling mechanism, the water layer was frozen into the ice layer, by which the Si wafer 1 and Si wafer supporting member 26 were strongly adhered to each other. Otherwise, the Si wafer 1 sprayed with water over its back side to form a water layer may be placed on the Si wafer supporting member 26 whose surface was cooled beforehand. In this case, the ice layer was formed and as soon as the Si wafer 1 is placed on the Si wafer supporting member 26, thereby fixing them.

(3) Next, the film-shaped, flexible supporting substrate 13 was adhered to the thin-film semiconductor 28. The supporting substrate 13 was sized larger than the Si wafer 1, so that it can extend beyond the Si wafer 1 on which it was placed. When an adhesive tape with adhesive thereon supported by a supporting substrate base was used as the supporting substrate 13, the adhesive coating and curing steps can be saved to greatly improve productivity. Or otherwise, the supporting substrate 13 may be placed on, and adhered to, the thin-film semiconductor 28, after an adhesive is spread over the latter. The materials useful for the supporting substrate 13 include polyester, polycarbonate, polyvinyl chloride, ethylene-vinyl acetate copolymer, ethylene-ethyl acrylate copolymer, polyethylene, polypropylene, ethylene-propylene copolymer, polyethylene terephthalate, and ethylene-tetrafluoroethylene copolymer. The adhesives useful for adhering the supporting substrate to the thin-film semiconductor include acrylic, epoxy, silicone and fluorine resins.

When the adhesive tape is used as the supporting substrate 13, the adhesive for the adhesive tape is preferably curable by activation energy, since a strong adhesive force is obtained. The activation energy used therefor includes ultraviolet ray, infrared ray, electron ray, X ray or supersonic waves.

When the supporting substrate 13 is adhered to the thin-film semiconductor 28 provided with an adhesive layer, the adhesive therefor is preferably of highly light-transmittable resin, e.g., EVA or EEA, for the thin-film semiconductor 28 to be used for solar cells. In one of the examples to use a thermoplastic or thermosetting resin for the above purpose, the thin-film semiconductor 28 and supporting substrate 13 are pressed under heating with interposition of the adhesive resin sheet therebetween to adhere them to each other. Care must be taken when they are heated not to melt the ice layer, and it is preferable that they are heated instantaneously. The above steps (2) and (3) may be reversed. In other words, the Si wafer 1 may be fixed on the Si wafer supporting member 26, after the supporting substrate 13 is adhered to the thin-film semiconductor 28.

(4) The end portions of the supporting substrate 13 extending beyond the Si wafer 1 were fixed on the thin-film supporting member 27 with curved surface. One example of the fixing methods is to insert the end portions of the supporting substrate 13 into the grooves 29 provided on the surface of the thin-film supporting member 27, and then to press and fix the supporting substrate 13 by the plate-shaped supporting substrate fixing member 29.

(5) Then, the thin-film supporting member 27 was rotated, to peel off the thin-film semiconductor 28 while it was adhered to the supporting substrate 13. It is necessary for the thin-film supporting member to rotate smoothly without sliding on the Si wafer supporting member 26. Therefore, a sliding-preventive means, e.g., knurling or rack and pinion gear, is preferably provided in a portion where the Si wafer supporting member 26 comes into contact with the thin-film supporting member 27. An elastic member (e.g., rubber) on the curved portion of the thin-film supporting member 27 reduces damages of the thin-film semiconductor 28 and, at the same time, prevents the thin-film supporting member 27 from sliding on the thin-film semiconductor 28. In addition, an auxiliary peeling force may be applied to between the Si wafer 1 and thin-film semiconductor 28, when they are peeled off from each other. The methods for applying such an auxiliary force include mechanically driving a wedge, ejection of a fluid, and bombardment with electromagnetic waves.

(6) Finally, the cooling means which fixed the Si wafer 1 was released, to recover the Si wafer 1. The Si wafer 1 can be reused by mechanically or chemically removing the remaining separation layer (residual porous layer or the like) therefrom. The Si wafer can be peeled off without being damaged in the least by the method of the present invention, and the number of reuse times can be increased to reduce the thin-film semiconductor production cost. The thin-film semiconductors produced by the method of the present invention are applicable, e.g., to light-emitting diodes and field effect transistors, in addition to solar cells.

Embodiment 5

Embodiment 5 will be described the production method of a solar cell, which comprises forming an ice plate on the semiconductor layer deposited on the porous Si layer, and separating the thin-film semiconductor layer by using the ice plate as the holding substrate. FIGS. 10A to 10F and 11A to 11C show the schematic sectional views illustrating the production steps of Embodiment 5.

The $p^+$ type Si wafer 1, sealed at the edges, was dipped in a solution of hydrofluoric acid and ethanol, to form the porous layer 2 on one side by anodization (FIG. 10A). The anodization current was changed in two stages, whereby the porous layer 2 had the double-layer porous structure having dense and loose porosities.

The Si wafer 1 provided with the porous Si layer 2 was annealed in a hydrogen atmosphere, and then dipped in a metallic indium solution supersaturated with Si to be slowly cooled. As a result, the p⁻ type single-crystal Si layer 4 was grown in the liquid phase on the porous Si layer 2 to a thickness of several tens µm. The Si wafer 1 was masked by a jig along its periphery to control the growth region, in order to form the p⁻ type single-crystal Si layer 4 on the concentric region smaller than the si wafer 1 (FIG. 10B).

The p⁻ type single-crystal Si layer 4 thus grown was coated with a diffusing agent containing phosphorus (P), and treated for thermal diffusion in a nitrogen atmosphere to form the n⁺ type single-crystal Si layer 5 (FIG. 10C). Pure water was sprayed over the back side of the Si wafer 1, i.e., the side on which the n⁺ type single-crystal Si layer 5 was not formed, and the Si wafer 1 was stuck on the supporting table 15 of aluminum by utilizing surface tension of the water. An adequate quantity of pure water was spread over the n⁺ type single-crystal Si layer 5 drop by drop and the uniform water layer 32 was formed by placing the thin film 31 on the spreaded water (FIG. 10D). The whole system, including supporting table 15, was cooled slowly to freeze the water layers 32. As a result, the Si wafer 1 was strongly adhered to the supporting table 15, and the ice plate (hereinafter referred to as "ice substrate") 14 was formed which was strongly adhered to the n⁺ type single-crystal Si layer 5. The ice substrate 14 started to shrink as temperature was further decreased, the stress resulting from the shrinkage acted on the porous Si layer 2 of more fragile structure to break the layer, and the single-crystal Si layers 4 and 5 were separated from the Si wafer 1 (FIG. 10E).

Figure 11A:
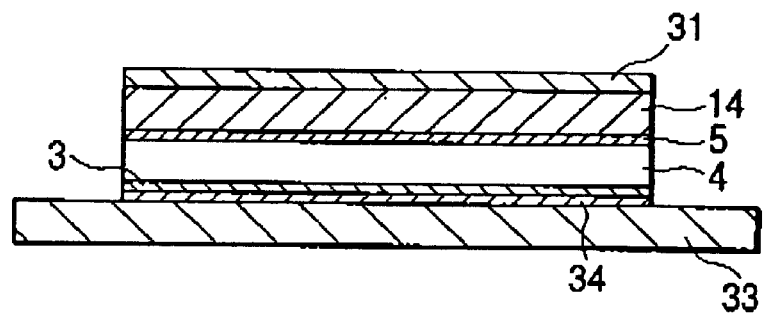
FIGS. 11A, 11B and 11C are schematic sections showing the production steps of Embodiment 5 of the present invention.
Figure 11B:
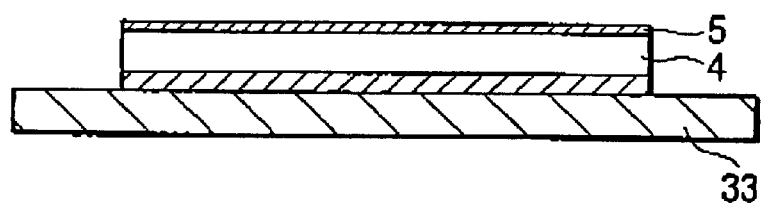
Figure 11C:
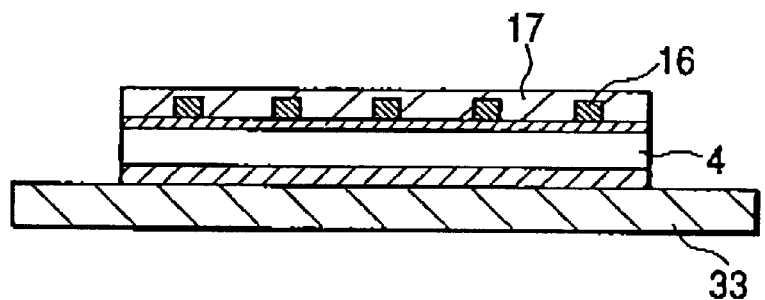

The assembly of the single-crystal Si layers 4 and 5 with an ice substrate, separated from the Si Wafer 1, was placed with the back side down on, and the back side was closely attached to, the stainless steel substrate 33 coated with the Al paste 34, while carrying the ice substrate 14. The whole system was treated with hot wind blown thereto to melt the ice substrate 14 and remove the film 31 and water droplets, and, after being adequately dried, the whole system was heated in an oven to sinter the Al paste (FIG. 11A). During this step, the Si layers 4 and 5 were strongly adhered to the stainless steel substrate, and, at the same time, Al diffused through the separation surface of the Si layer 4 to form the p⁺ type single-crystal Si layer 3 (FIG. 11B). The grid electrode 16 and antireflection layer 17 were formed on the surface on which the n⁺ type single-crystal Si layer 5 is formed (FIG. 11C), to make a solar cell. The characteristics of the solar cell were evaluated and it was found that the solar cell had good characteristics.

The p⁺ type Si wafer 1 was heated to be removed from the Al supporting table 15, and chemically treated to remove the residual porous Si layer (FIG. 10F). It could be reused to produce the solar cell again, which showed almost the same characteristics as the initial one.

Embodiment 5 needs no adhesion of the resin substrate to the Si wafer, and hence is free of the associated problems, e.g., consideration of selecting the substrate and adhesive materials, costs therefor, and pollution by the adhesive. As a result, relatively-high-temperature processing can be applied in the process after the separation, so that it has high freedom of process, and gives a solar cell of high efficiency.

Embodiment 6

In Embodiment 6, peeling off of the single-crystal Si layers from the Si wafer was carried out by chucking with pure water frozen in the porous spacer as the holding means.

Figure 12A:
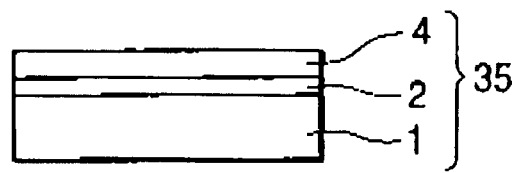
FIGS. 12A, 12B and 12C are schematic sections showing the production steps of Embodiment 6 of the present invention.

FIG. 12A shows the schematic sectional view of the substrate 35 on which the single-crystal Si layer is formed for Embodiment 6. The substrate 35 was anodized in an aqueous solution of hydrogen fluoride to have a number of fine pores on the surface of the Si wafer 1, to form the porous Si layer 2. It was then annealed with hydrogen to adjust the wafer surface conditions, to form the single-crystal Si layer 4 on the porous Si layer 2 by the liquid-phase growth. The substrate 35 still retained the porous Si layer 2 inside, even after the single-crystal Si layer 4 was deposited thereon. The wafer used has a nominal size of 5 inches (125 mm In outer diameter) and thickness of 0.6 mm. The porous Si layer 2 formed by anodization had a thickness of about 10 µm. The single-crystal Si layer 4 formed on the porous Si layer 2 had a thickness of less than 50 µm.

Figure 12B:
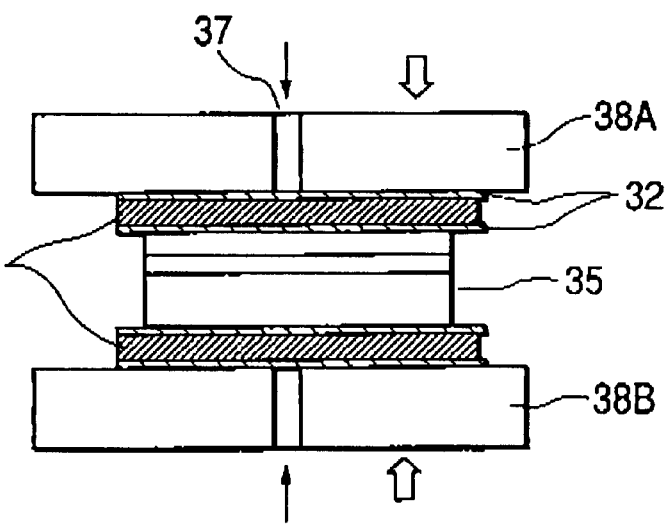

FIG. 12B shows the schematic sectional view of the main part of the wafer chuck with the substrate 35 set on the peeling apparatus. The chuck is used to separate the single-crystal Si layer 4 deposited on the porous Si layer 2. The peeling apparatus comprises two peeling plates 38A and 38B, each provided with the water supply passage 37. The wafer is assembled under pressure via the porous spacer 36 between the peeling plates 38A and 38B.

The porous spacer 36 is made of a foamed material, e.g., polymer resin, ceramic or metal, to have a number of fine pores. It efficiently retains water, penetrating throughout the body by the function of capillarity when it is immersed in water.

After the substrate 35 was fixed, sufficiently degassed pure water was supplied to the porous spacer 36 through the water supply passages 37 in the peeling plates 38A and 38B. Pure water was supplied until the pores in the porous spacer 36 were filled therewith after it penetrated throughout the spacer body and drove out air from the pores.

The substrate 35 and peeling plates 38A and 38B were cooled together, after pure water supply was stopped, to freeze pure water in the porous spacer 36, and the water layers 32 between the porous spacers 36 and the peeling plates 38A and 38B and between the spacers and the substrate 35, and to chuck with frozen water the porous spacer 36 and the substrate 35 on the peeling plates 38A and 38B.

Figure 12C:
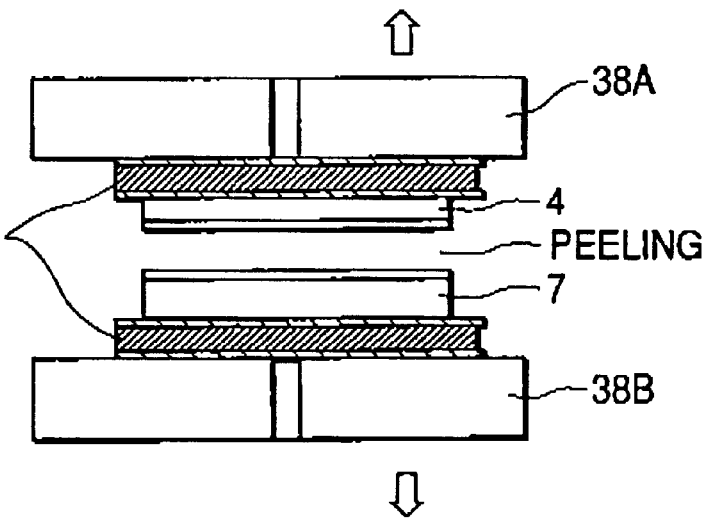

FIG. 12C shows the step of peeling off the single-crystal Si layer 4, formed on the substrate, from the Si wafer 1. The peeling plates 38A and 38B were pulled in the opposite directions, and the resultant tensile stress generated in the Si wafer 1 caused brittle fracture of the porous Si layer 2 of lower strength, to peel off the single-crystal Si layer 4 from the Si wafer 1. These plates were pulled exactly in the opposite directions in the figure, but may be pulled in the oblique directions to reduce the tension. Providing a fulcrum on each of these peeling plates 38A and 38B helps reduce damages of the wafer at the edges.

The conventional method peels off the thin-film semiconductor from the single-crystal Si wafer on which it is formed after the Si wafer is adhered to a supporting plate or the like by an adhesive or the like spread over the entire surface of the Si wafer.

Therefore, removal of the supporting plate, after the thin-film semiconductor is peeled off, needs high temperature or a chemical agent. The chucking with the porous spacer and frozen water could dispense with these steps involved in the conventional method, to greatly increase productivity and product yield and reduce cost. It can also cope with varying wafer sizes by only changing porous spacer sizes, without needing to modify the peeling plates.

Embodiment 7

Figure 13A:
FIGS. 13A, 13B, 13C, 13D, 13E and 13F are schematic sections showing the production steps of Embodiment 7 of the present invention.
Figure 13B:
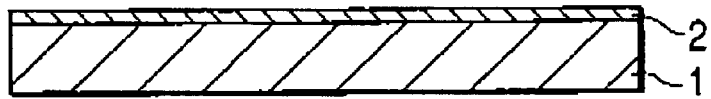

In Embodiment 7, freezing-point depression of water was utilized for chucking the wafer. FIGS. 13A to 13F, 14A to 14E, 15A and 15B show the schematic sectional views illustrating the solar cell production steps of Embodiment 7. First, the Si wafer 1 was prepared as shown in FIG. 13A. This Si wafer 1 was of p-type, having a resistivity of 0.01 to 0.02 Ωcm. It was set in an anodization apparatus containing, e.g., an aqueous solution of 49% HF (HF:$H_2O$=10:1), and a voltage was applied to pass current at a current density of, e.g., 8 mA/$cm^2$ for 10 min, and then the current density was sharply changed to, e.g., 20 mA/$cm^2$ for about 5 min without stop of passing current. As a result, the porous Si layer 2 could be formed on the Si wafer 1, as shown in FIG. 13B.

The $p^+$ type single-crystal Si layer 3 was epitaxially grown in liquid phase. The substrate shown in FIG. 2B was set in a liquid-phase growth apparatus, where it heated to, e.g., 1100° C. in a hydrogen atmosphere, at which it was treated with hydrogen for 1 min. After the high temperature treatment, silane ($SiH_4$) gas may be passed to the surface of the porous Si layer to keep it under conditions suitable for further growth.

Figure 13C:
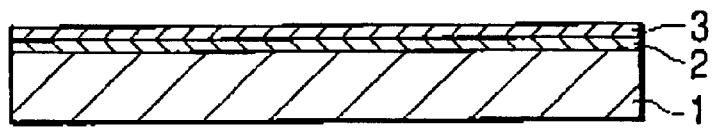

Indium was used as the solvent, in which Si as the raw material and a dopant in a quantity necessary to produce $p^+$ type Si were dissolved for the growth step, and held at a constant temperature of 960° C. to keep the solution saturated. Then, the substrate and solvent were slowly cooled to keep the solution supersaturated to some extent. At this stage, the solvent was brought into contact with the surface of the substrate shown in FIG. 13B and then slowly cooled. The $p^+$ type single-crystal Si layer 3 was grown on the porous Si layer 2. The growth conditions were solvent temperature: 950° C. decreased to 940° C., slowly cooling rate: 1° C./min, and dipping time (growth time): approximately 10 min. Approximately 10 μm thick $p^+$ type single-crystal Si layer was grown (FIG. 13C). This layer is for the back surface field (BSF) effect, and may not be necessary.

Figure 13D:
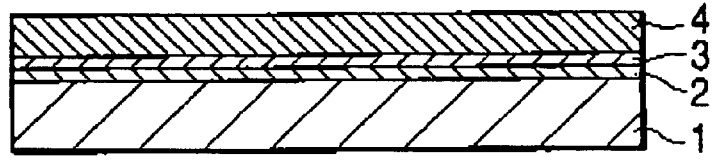

Then, the solvent containing the $p^+$ type Si was exchanged by the solvent for growth of the $p^-$ type Si, and the substrate to be molten was exchanged by the $p^-$ type Si, which was dissolved in the solvent, and the $p^-$ type single-crystal Si layer 4 was grown by the liquid-phase growth, similarly as in the above manners. It was dipped for approximately 30 min, to grow the approximately 30 μm thick $p^-$ type single-crystal Si layer 4 (FIG. 13D).

Figure 13E:
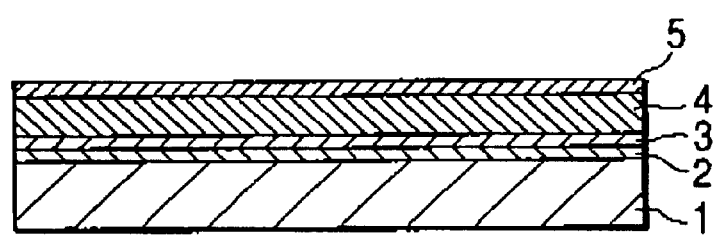

Similarly, the solvent containing the $p^-$ type Si was exchanged by the solvent for growth of the $n^+$ type Si, and the substrate to be molten was exchanged by the $n^+$ type Si, which was dissolved in the solvent. The $n^+$ type single-crystal Si layer 5 was similarly grown in the liquid phase to have a thickness of 0.2 to 0.3 μm (FIG. 13E). The substrate, after forming the $p^+$ type single-crystal Si layer 3, $p^-$ type single-crystal Si layer 4 and $n^+$ type single-crystal Si layer 5, is withdrawn from the apparatus for liquid-phase growth.

Figure 13F:
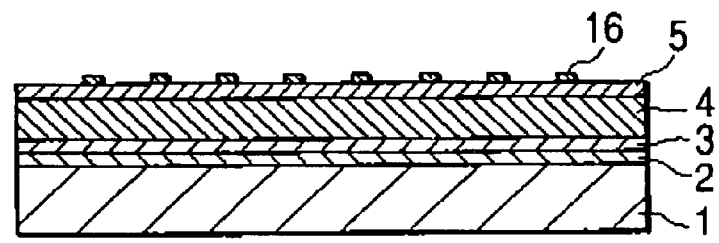
Figure 14A:
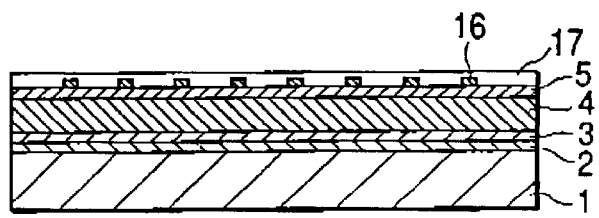
FIGS. 14A, 14B, 14C, 14D and 14E are schematic sections showing the production steps of Embodiment 7 of the present invention.
Figure 14B:
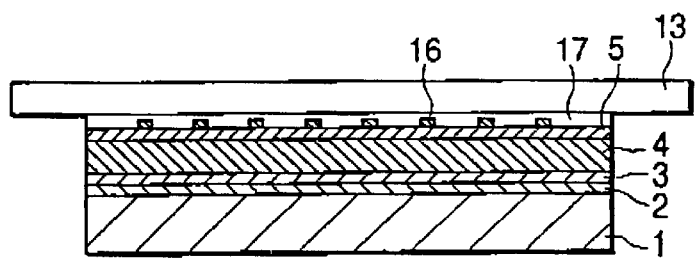
Figure 14C:
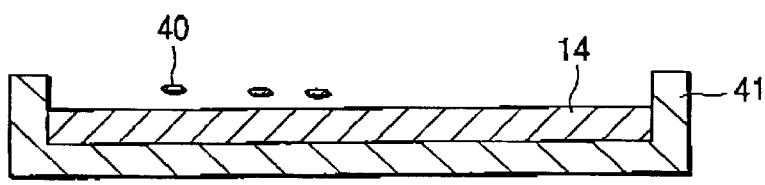

Next, the grid electrode 16 was formed on the $n^+$ type single-crystal Si layer 5 by an adequate method, e.g., printing (FIG. 13F). Then, the antireflection layer 17 was formed on the grid electrode 16 and $n^+$ type single-crystal Si layer 5 (FIG. 14A). The light-transmittable supporting substrate 13 was adhered to the antireflection layer 17, after the latter was coated with a light-transmittable adhesive. The adhesive was cured to adhere them to each other (FIG. 14B). Glass and common plastic materials such as polycarbonate and polyethylene terephthalate can be used for the supporting substrate 13.

Figure 14D:
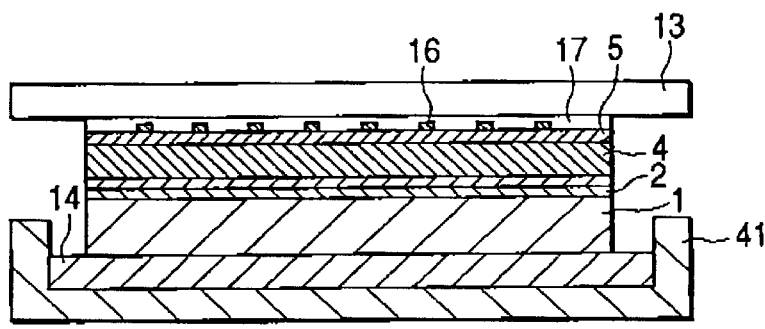

Next, the films for forming the solar cell were separated from the Si wafer 1 at the porous Si layer 2. This process utilizes the porous Si layer 2 having a number of voids therein, and therefore the porous layer 2 is inferior to the Si wafer 1 and single-crystal Si layers 3, 4 and 5 grown in the liquid phase in mechanical properties, e.g., tensile, compression and shear strengths. Plate shaped ice was placed in an insulating container 41, e.g., that of foamed styrol or vacuum bottle, to form the ice layer 14. Then, the ice layer 14 was coated with a chemical agent, e.g., salt, ammonium sulfate or calcium chloride, as uniformly as possible, to once melt the ice surface, and the Si wafer 1 was placed, with its back side down, on the ice layer 14 surface coated with the chemical agent. This again freezed water of molten ice, and the Si wafer 1 could be adhered to the ice layer 14 without needing a cooling mechanism (FIG. 14D).

Figure 14E:
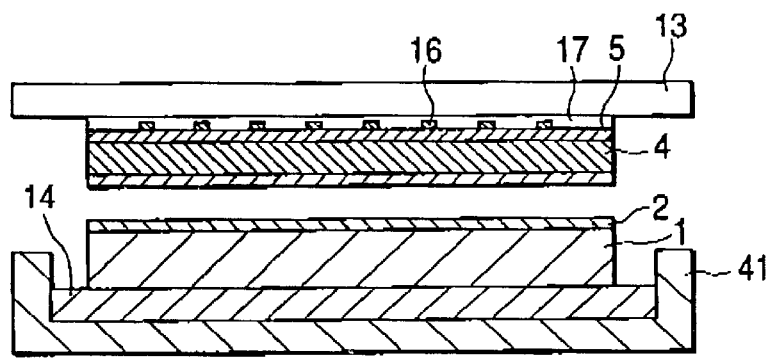
Figure 15A:
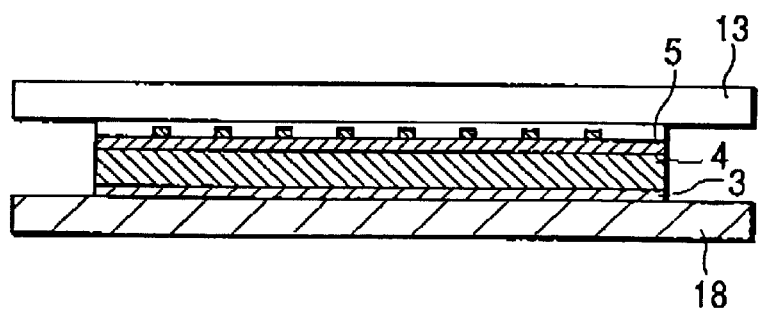
FIGS. 15A and 15B are schematic sections showing the production steps of Embodiment 7 of the present invention.

The container 41 and supporting substrate 13 were pulled in the opposite directions, and the resultant tensile stress caused brittle fracture of the porous Si layer 2 of lower strength, to separate the Si wafer 1 from the single-crystal Si layers 3, 4 and 5 (FIG. 14E). Then, the electroconductive substrate 18 of, e.g., stainless steel, was adhered to the back side of the $p^+$ type substrate by an electroconductive adhesive, to finish production of the unit solar cell of thin-film single-crystal Si (FIG. 15A).

Figure 15B:
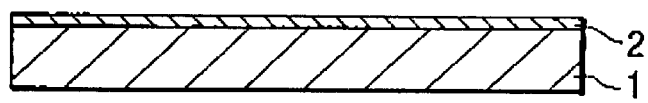

The ice layer 14 was removed from the Si wafer 1 separated from the single-crystal Si layers 3, 4 and 5 by melting the ice layer 14 (FIG. 15B). The Si wafer was immersed in an alkaline etchant to remove the residual porous Si layer 2 on the surface, to reclaim the Si wafer. The reclaimed Si wafer 1 can be reused repeatedly in a similar manner by forming the porous Si layer thereon.

The method of Embodiment 7 needs neither a special apparatus (e.g., vacuum adsorption mechanism) nor an adhesive for holding the Si wafer. Moreover, it needs no cooling mechanism, once plate-shaped ice is prepared, thereby further helping to reduce the production cost.

Embodiment 8

Figure 16A:
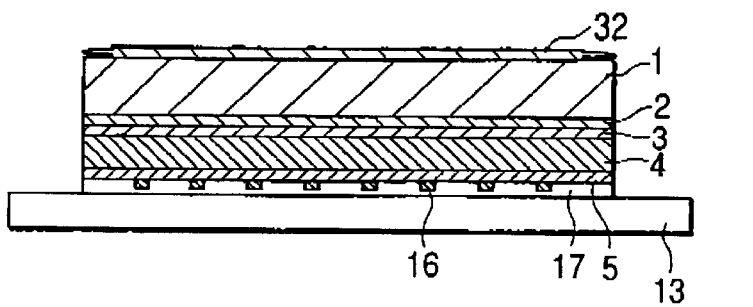
FIGS. 16A, 16B, 16C and 16D are schematic sections showing the production steps of Embodiment 8 of the present invention.
Figure 16B:
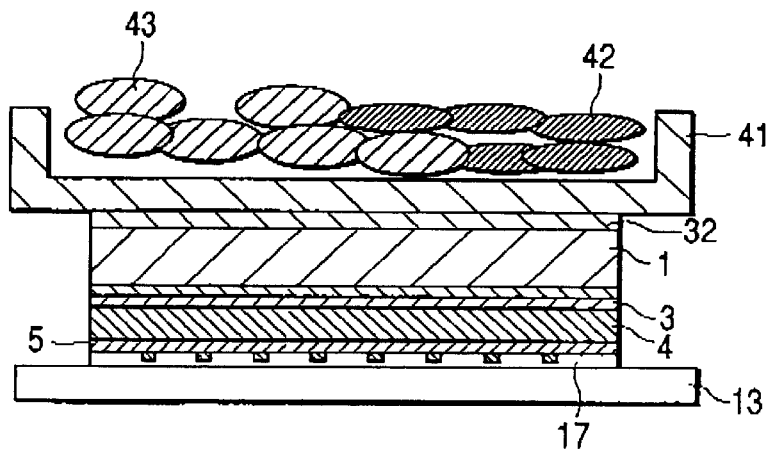

In Embodiment 8, water was freezed into ice by utilizing an endothermic reaction in order to chuck the wafer. FIGS. 16A to 16D and 17E to 17G show the schematic sections illustrating the production steps of Embodiment 8. This embodiment prepares the $n^+$ type single-crystal Si layer and grid electrode 16, adhered to each other by the procedure shown by FIGS. 13A to 13F for illustrating Embodiment 7. The antireflection layer 17 was formed on the $n^+$ type single-crystal Si layer 5 and the grid electrode 16 of the substrate as provided in FIG. 13F, and adhered to the transparent supporting substrate 13. The assembly was turned up side down (FIG. 16A). Water was sprayed by a sprayer or the like onto the back side of the Si wafer 1 to form the water layer 32 on which a petri dish-shaped container 41 was placed. The container 41 preferably has a structure with insulated sides and heat conductive bottom. The chemical agents 42 and 43, e.g., ammonium nitrate ($NH_4NO_3$) and barium hydroxide octahydrate which react with each other to cause the endothermic reaction, were mixed with each other in the container 41 (FIG. 16B).

Figure 16C:
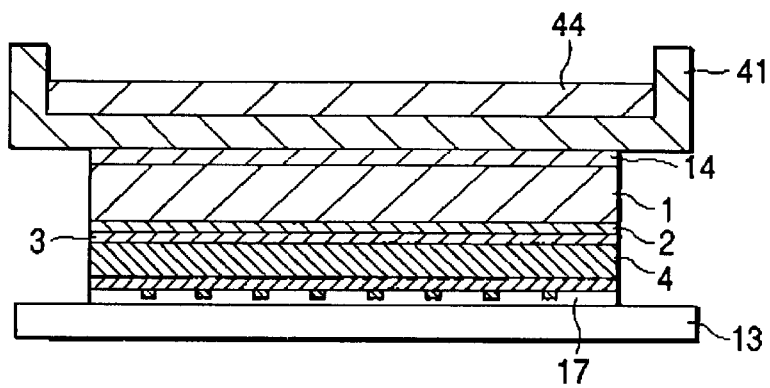
Figure 16D:
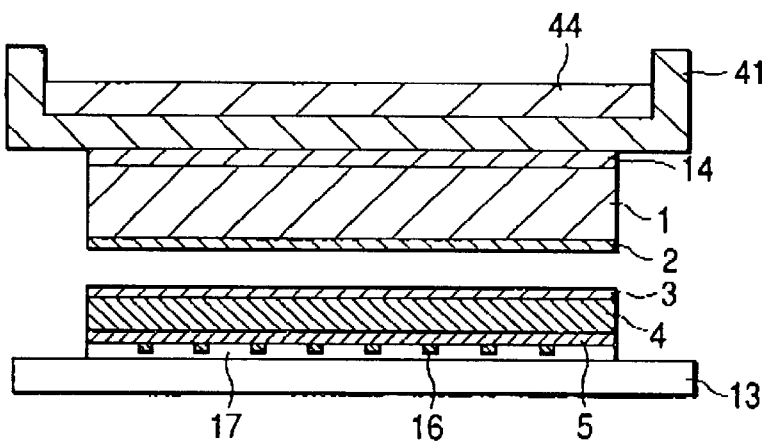

The endothermic reaction started when the chemical agents 42 and 43 were mixed with each other to form the chemical agent 44. This freezed the water layer 32 below the container 41 into the ice layer 14, by which the back side of the Si wafer 1 was adhered to the container 41 (FIG. 16C). The container 41 and supporting substrate 13 were pulled in the opposite directions, and the resultant tensile stress caused brittle fracture of the porous Si layer 2 of lower strength, to separate the Si wafer 1 from the single-crystal Si layers 3, 4 and 5 (FIG. 16D).

Figure 17E:
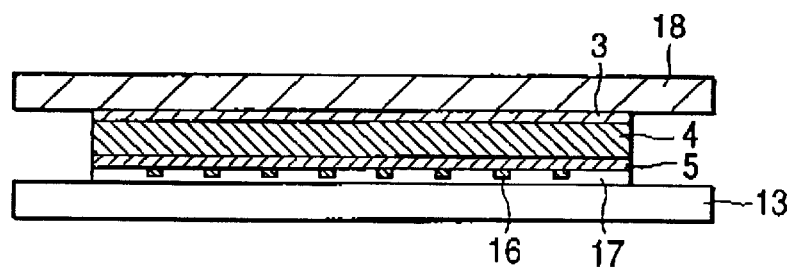
FIGS. 17E, 17F and 17G are schematic sections showing the production steps of Embodiment 8 of the present invention.
Figure 17F:
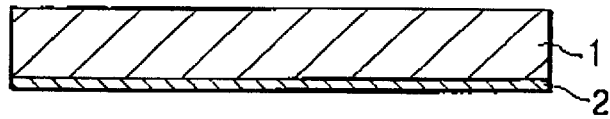
Figure 17G:

Then, the electroconductive substrate 18 of, e.g., stainless steel, is adhered to the separated side of the p⁺ type single-crystal Si layer 3 with an electroconductive adhesive, to finish production of the unit solar cell (FIG. 17E). The ice layer 14 is molten naturally or under heating, to separate the Si wafer 1 from the container 41 (FIG. 17F). The Si wafer 1 is immersed in an alkaline etchant to remove the residual porous Si layer 2 on the surface, to reclaim the Si wafer 1 (FIG. 17G). The reclaimed Si wafer 1 can be repeatedly used similarly to the above manners by forming the porous Si layer thereon.

The method of Embodiment 8 needs none of a special apparatus such as a vacuum adsorption mechanism and an adhesive for holding the Si wafer. Further, it needs no cooling mechanism, thereby helping to reduce the production cost.

In the method of the present invention, the semiconductor layer and the semiconductor substrate are separated at the separation layer, where the semiconductor substrate or semiconductor layer is held by a holding means via an ice layer. Therefore, the semiconductor substrate or semiconductor layer Is strongly held to the holding means during the separation step, to help securely separate the semiconductor substrate and semiconductor layer from each other. The semiconductor substrate or semiconductor layer can be easily separated from the holding means, leaving nothing behind, after the separation step by returning its temperature back to room temperature, while minimizing damages of the semiconductor substrate and semiconductor layer. When S the separation method of the present invention is applied to production of solar cells, the number of use times of the semiconductor substrate increases to greatly reduce the production cost.

What is claimed is:

1. A separation method of a semiconductor layer, which comprises separating a semiconductor layer and a semiconductor substrate at a separation layer formed therebetween, wherein a face of the semiconductor substrate at a side opposite to the separation layer is held by utilizing an ice layer, and wherein the semiconductor layer and the semiconductor substrate are separated in a direction perpendicular to the face of the semiconductor substrate.

2. The separation method of a semiconductor layer according to claim 1, wherein the ice layer is closely adhered to holding means.

3. The separation method of a semiconductor layer according to claim 2, wherein the holding means is a substrate.

4. The separation method of a semiconductor layer according to claim 1, wherein the ice layer is used as a holding substrate.

5. The separation method of a semiconductor layer according to claim 1, wherein the semiconductor substrate is a Si wafer.

6. The separation method of a semiconductor layer according to claim 1, wherein the separation layer is a porous Si layer.

7. The separation method of a semiconductor layer according to claim 1, wherein the semiconductor layer is epitaxially grown.

8. A separation method of a semiconductor layer, which comprises separating a semiconductor layer and a semiconductor substrate at a separation layer formed therebetween, wherein a face of the semiconductor layer at a side opposite to the separation layer is held by utilizing an ice layer, and wherein the semiconductor layer and the semiconductor substrate are separated in a direction perpendicular to the face of the semiconductor layer.

9. The separation method of a semiconductor layer according to claim 8, wherein the ice layer is closely adhered to holding means.

10. The separation method of a semiconductor layer according to claim 9, wherein the holding means is a substrate.

11. The separation method of a semiconductor layer according to claim 8, wherein the ice layer is used as a holding substrate.

12. The separation method of a semiconductor layer according to claim 8, wherein the semiconductor substrate is a Si wafer.

13. The separation method of a semiconductor layer according to claim 8, wherein the separation layer is a porous Si layer.

14. The separation method of a semiconductor layer according to claim 8, wherein the semiconductor layer is epitaxially grown.

15. A separation method of a semiconductor layer, which comprises separating a semiconductor layer and a semiconductor substrate at a separation layer formed therebetween, wherein a face of the semiconductor layer at a side opposite to the separation layer and a face of the semiconductor substrate at a side opposite to the separation layer are held by utilizing a respective ice layer, and wherein the semiconductor layer and the semiconductor substrate are separated in a direction perpendicular to the face of the semiconductor layer and the face of the semiconductor substrate.

16. A production method of a solar cell, which comprises using a semiconductor layer separated by the separation method of a semiconductor layer according to any one of claims 1 to 15 as an active layer for a solar cell.

* * * * *

UNITED STATES PATENT AND TRADEMARK OFFICE
CERTIFICATE OF CORRECTION

PATENT NO. : 6,682,990 B1
APPLICATION NO. : 09/656014
DATED : January 27, 2004
INVENTOR(S) : Masaaki Iwane et al.

It is certified that error appears in the above-identified patent and that said Letters Patent is hereby corrected as shown below:

COLUMN 3:
Line 26, "effects is" should read --effects are--;
Line 31, "other when" should read --other. When--; and
Line 49, "-21°C." should read -- -20°C.--.

COLUMN 5:
Line 16, "Embodiment 1 will" should read --In Embodiment 1 will--; and
Line 35, "p type, but n type" should read --p-type, but n-type--.

COLUMN 6:
Line 11, "(L/C)" should read --(UL/C)--.

COLUMN 7:
Line 9, "concretely" should read --concretely.--.

COLUMN 8:
Line 66, "Embodiment 2 will" should read --In Embodiment 2 will--.

COLUMN 9:
Line 28, "electrode 16" should read --electrode 16.--.

COLUMN 10:
Line 19, "Embodiment 3 will" should read --In Embodiment 3 will--.

COLUMN 12:
Line 55, "Embodiment 5 will" should read --In Embodiment 5 will--.

COLUMN 13:
Line 33, "Wafer" should read --wafer--.

COLUMN 14:
Line 11, "In" should read --in--.

UNITED STATES PATENT AND TRADEMARK OFFICE
CERTIFICATE OF CORRECTION

PATENT NO. : 6,682,990 B1
APPLICATION NO. : 09/656014
DATED : January 27, 2004
INVENTOR(S) : Masaaki Iwane et al.

It is certified that error appears in the above-identified patent and that said Letters Patent is hereby corrected as shown below:

COLUMN 17:
Line 22, "Is" should read --is--; and
Line 29, "When S" should read --When--.

Signed and Sealed this

Nineteenth Day of December, 2006

JON W. DUDAS
*Director of the United States Patent and Trademark Office*